(12) United States Patent
Chibana

(10) Patent No.: US 7,538,852 B2
(45) Date of Patent: May 26, 2009

(54) EXPOSURE APPARATUS AND DEVICE MANUFACTURING METHOD

(75) Inventor: Takahito Chibana, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/688,955

(22) Filed: Mar. 21, 2007

(65) Prior Publication Data

US 2007/0159608 A1 Jul. 12, 2007

Related U.S. Application Data

(62) Division of application No. 10/988,514, filed on Nov. 16, 2004, now Pat. No. 7,218,377.

(30) Foreign Application Priority Data

Nov. 18, 2003 (JP) ............................... 2003-388198

(51) Int. Cl.
*G03B 27/42* (2006.01)
*G03B 27/52* (2006.01)
*G03B 27/54* (2006.01)
*G21K 5/00* (2006.01)

(52) U.S. Cl. ............................ 355/30; 355/53; 355/67; 378/34

(58) Field of Classification Search .................... 355/53, 355/67, 71; 378/34, 35
See application file for complete search history.

(56) References Cited

U.S. PATENT DOCUMENTS

| 5,997,963 | A | 12/1999 | Davison et al. | ............. 427/582 |
|---|---|---|---|---|
| 6,542,220 | B1 | 4/2003 | Schrijver et al. | ............... 355/53 |
| 6,555,834 | B1 | 4/2003 | Loopstra | ................... 250/492.3 |
| 6,665,046 | B2 | 12/2003 | Nogawa et al. | ................ 355/30 |
| 6,731,371 | B1 | 5/2004 | Shiraishi | ....................... 355/30 |
| 2002/0018190 | A1 | 2/2002 | Nogawa et al. | ................ 355/30 |
| 2003/0006380 | A1 | 1/2003 | Van Empel et al. | ...... 250/492.3 |
| 2003/0025889 | A1* | 2/2003 | Hasegawa et al. | ............. 355/30 |
| 2003/0146396 | A1 | 8/2003 | Loopstra | ................... 250/492.2 |
| 2005/0030496 | A1 | 2/2005 | Chibana et al. | ................ 355/30 |
| 2006/0012765 | A1 | 1/2006 | Kameyama | .................... 355/53 |
| 2006/0114435 | A1 | 6/2006 | Hazelton et al. | ............... 355/53 |
| 2006/0164615 | A1 | 7/2006 | Hirukawa | ...................... 355/53 |

FOREIGN PATENT DOCUMENTS

| JP | 2001-210587 | 8/2001 |
|---|---|---|
| JP | 2001-358056 | 12/2001 |
| JP | 2002-513856 | 5/2002 |
| JP | 2003-53892 | 2/2003 |

* cited by examiner

Primary Examiner—Hung Henry Nguyen
(74) Attorney, Agent, or Firm—Fitzpatrick, Cella, Harper & Scinto

(57) ABSTRACT

An exposure apparatus includes a projection optical system for projecting a pattern of an original onto a substrate, a stage for holding the substrate, a cover for substantially surrounding an exposure light path, from an end portion of the projection optical system, at a side facing the stage, to the stage, a first supply port provided inside the cover, for supplying a purge gas into a space surrounded by the cover, and a first exhaust port provided in an end portion of the cover at a side facing the stage, for exhausting the gas.

5 Claims, 18 Drawing Sheets

//EXPOSURE APPARATUS AND DEVICE MANUFACTURING METHOD

This application is a divisional application of U.S. patent application Ser. No. 10/988,514, filed on Nov. 16, 2004.

FIELD OF THE INVENTION AND RELATED ART

This invention relates generally to an exposure apparatus for projecting a pattern of a mask onto a photosensitive substrate through a projection optical system and, more particularly, to an exposure apparatus that uses ultraviolet light as exposure light.

The procedure of the production of semiconductor devices comprising a very fine pattern, such as LSIs or VLSIs, uses a reduction type projection exposure apparatus arranged to project, in a reduced scale, a circuit pattern formed on a mask onto a substrate having a coating of a photosensitive material, thereby to print the pattern on the latter. Since the packaging density of semiconductor devices has increased considerably, a reduction in size and width of a printed pattern has been required more and more. Thus, development of a resist process has been strengthened on one hand, and improvement of the exposure apparatus to meet the device miniaturization has been promoted on the other hand.

As regards deep ultraviolet light, particularly, an ArF excimer laser having an emission wavelength of about 193 nm or a fluorine ($F_2$) excimer laser having an emission wavelength of about 157 nm, it is known that there is an oxygen ($O_2$) or moisture ($H_2O$) absorbing band in the bandwidth region near these emission wavelengths. This means that, regarding the light path of an exposure optical system of a projection exposure apparatus in which deep ultraviolet light, such as an ArF excimer laser or a fluorine ($F_2$) excimer laser is used as a light source, the concentration of a disturbing substance (hereinafter, this will be referred to also as an "impurity concentration"), such as oxygen or moisture, should be maintained at a low level, of a ppm order.

To this end, the light path of exposure light in exposure apparatuses is partially purged by the use of an inactive or inert gas. FIGS. 16, 17 and 18 are sectional views, respectively, each showing a known exposure apparatus having purge means for partially purging the space near a wafer.

More specifically, FIG. 16 shows a sectional structure, near a wafer, of an exposure apparatus, as disclosed in Japanese Laid-Open Patent Application, Publication No. 2001-358056. This apparatus is provided with a cover 9 that covers the exposure light path from the wafer-side lower end portion of a projection optical system 5 near a wafer stage 10, and a supply port 6 for blowing a purge gas, consisting of an inactive gas, into the inside of the cover 9. By supplying a purge gas into the cover 9 inside, gas purging is carried out. Here, in order to prevent the outside atmosphere from entering into the inside of the cover 9 from the outside thereof, the inside pressure of the cover 9 is made higher than the outside pressure, and also, the purge gas supplied into the inside of the cover 9 from the supply port 6 is caused to flow outwardly from the cover 9 through the clearance between the cover 9 and the wafer 11. In FIG. 16, denoted at 8 is the flow of purge gas. Denoted at 27 is a base table of the projection optical system, and denoted at 28 is a base table of a wafer stage.

FIG. 17 shows an exposure apparatus as disclosed in Japanese Laid-Open Patent Application, Publication No. 2002-513856. In this apparatus, a stage member 203 includes a gas bearing 215 formed to surround the wafer supporting surface 213 of the stage member 203. The gas bearing 215 includes lands 216, 217, 218 and 219 formed on the stage member 203. A supply channel 220 is defined between the lands 216 and 217, while a supply channel 222 is defined between the lands 218 and 219. Inactive gases are supplied through these channels. Additionally, an exhausting channel 221 is defined between the lands 217 and 218, to exhaust the gas. The attraction produced by this gas bearing 215 is sufficient to apply a load to or urge the stage member 203 relative to a reference member 202, such that the stage member 203 tends to be attracted to the reference member 203 actually without contacting thereto. Thus, this enables the structure that the stage member 203 and the reference member 202 are disposed close to each other, with a clearance maintained therebetween. With the provision of this clearance, the flow upon the land can be a relatively high speed flow, and it prevents surrounding air from flowing into a chamber 204. Hence, a substrate W can be sealed inside the chamber 204.

FIG. 18 shows an exposure apparatus as disclosed in Japanese Laid-Open Patent Application, Publication No. 2001-210587, and it illustrates a horizontal sectional view of a washing box 500 for a substrate stage, which comprises covers 510 and 520 that surround a central region 501 placed beneath a final element of a projection lens PL. In the exposure apparatus of FIG. 18, there are orifices 517 and 527 formed at the bottom faces of supply channels 511 and 523. Purge gases are supplied through these orifices whereby, as in the exposure apparatus of FIG. 17, gas bearings 518 and 528 for separate protection of covers 510 and 520 from a substrate W are provided. Outside the supply channels 511 and 523, there are exhaust channels 512 and 524 as well as a series of larger-size orifices 519 and 529 formed at the bottom faces of the channels. The purge gases from the gas bearings 518 and 528 are exhausted by this, whereby any atmospheric gas leaked to below the covers 510 and 520 is prevented from reaching the central region 501. Denoted at 521 is a purge gas supply channel, and denoted at 516 is an orifice 15 for supplying a purge gas to the central region 501 from the supply channel 521. Denoted at 540 is a skirt for restricting the flow of air leaking from under the covers 510 and 520 toward the central region 501.

Both of FIGS. 17 and 18 are examples of purge means wherein a gas bearing is formed. In the exposure apparatus of FIG. 17, a gas bearing is defined by forming a channel at the stage side, whereas, in the exposure apparatus of FIG. 18, a gas bearing is defined by forming a channel at the projection lens side.

On the other hand, in the trend of improvements in exposure apparatuses for dealing with device miniaturization, a strict precision of not greater than 10 nm is required for an X-Y positioning system for carrying a wafer thereon and positioning the same in place. To meet this requirement, a laser interferometer is used for the position measurement. In the distance measurement based on a laser interferometer, a change in gas concentration (variation of refractive index thereof) along the measurement light path is a factor of an error. The gas concentration (density) is variable with temperature and humidity. Thus, in order to reduce such variation, conventionally, this type of X-Y positioning system is provided with air conditioning means so that a temperature and humidity controlled gas is blown from a side face (or in the x or y direction) to thereby reduce a variation in temperature and humidity of the gas along the measurement light path.

FIG. 19 is a schematic and plan view, showing a known example of an X-Y positioning system, which is usable in the exposure apparatus of FIG. 16. In FIG. 19, denoted at 10 is a wafer stage, and denoted at 11 is a wafer. Denoted at 14 is an X-axis laser interferometer, and denoted at 15 is an X-axis measurement light path. Denoted at 16 is an X-axis measurement mirror. Denoted at 17 is a Y-axis laser interferometer, and denoted at 18 is a Y-axis measurement light path. Denoted at 19 is a Y-axis measurement mirror. Denoted at 20 is an air conditioning system, and denoted at 21 is a blown gas. In the structure described above, by means of the air conditioning system 20, temperature and humidity controlled gas 21 is blown, by which the temperature and humidity around the wafer stage or along the X-axis measurement light path 15 and Y-axis measurement light path 16 are stabilized.

In an exposure apparatus using deep ultraviolet light, as described above, a cover is provided at a wafer-side lower end portion of a projection optical system, while a supply port for blowing a purge gas into the inside of the cover is provided, by which the purge gas is supplied into the inside of the cover for purging of the same (FIG. 16). However, it has been found by the investigation made by the inventor of the subject application that, since the purge gas supplied into the inside of the cover flows outwardly from the inside of the cover and disperses around the wafer stage, there occurs non-uniformness of purge gas concentration around the wafer stage, which causes a measurement error of the laser interferometer. Such a measurement error directly causes defects of semiconductor devices produced, and a considerable decrease of productivity of the apparatus.

Now, referring to FIGS. 20A, 20B, 21A and 21B, an uneven purge gas concentration around the wafer stage, caused by the purge gas flowing outwardly from the inside of the cover, will be explained. FIGS. 20A, 20B, 21A and 21B are plan views, respectively, around the wafer stage 10, and they are schematic contour-line illustrations of a purge gas concentration distribution produced when the purge gas flows outwardly from the inside of the cover 9. In the contour-line illustrations of FIGS. 20A-21B, the darker the color is, the higher the purge gas concentration is, and the lighter the color is, the lower the purge gas concentration is. A white color area depicts a zone where no purge gas is present.

FIGS. 20A and 20B illustrate purge gas concentration distributions in a case wherein no air conditioning system is used. Referring to FIGS. 20A and 20B, a case wherein no air conditioning system is used will be explained first. FIG. 20A illustrates a purge gas concentration distribution as the wafer stage 10 has moved closest to the X-axis laser interferometer 14 and the Y-axis laser interferometer 17, in the exposure operation. FIG. 20B illustrates a purge gas concentration distribution as the wafer stage 10 has moved most remote from the X-axis laser interferometer 14 and the Y-axis laser interferometer 17, in the exposure operation.

It is seen that, between when the wafer stage 10 is closest to the laser interferometers 14 and 17 and when it is most remote from them, the purge gas concentration distribution along the X-axis measurement light path 15 and the Y-axis measurement light path 18 is different, and that, depending on the position of the wafer stage, there is a difference in non-uniformness of purge gas concentration in the X-axis measurement light path 15 and the Y-axis measurement light path 18.

The refractive index of the atmosphere and the refractive index of the purge gas are different. Therefore, the phenomenon of uneven purge gas concentration in the X-axis measurement light path 15 and the Y-axis measurement light path 18, with the wafer stage 10 position, means that, depending on the position of the wafer stage 10, the refractive index of the gas in the X-axis measurement light path 15 and the Y-axis measurement light path 18 is varying. This leads to a measurement error of the laser interferometer, causing many defects of product semiconductor devices and a considerable decrease of productivity of the apparatus.

FIGS. 21A and 21B are schematic contour-line illustrations of a purge gas concentration distribution, in a case wherein an air conditioning system 20 is provided to blow a gas toward a position opposed to a reflection surface 19a of the Y-axis measurement mirror, such that an air-conditioned gas is blown from the air conditioning system 20. FIG. 21A is a schematic contour-line illustration of a purge gas concentration distribution as the wafer stage 10 has moved closest to the X-axis laser interferometer 14 and the Y-axis laser interferometer 17, in the exposure operation. FIG. 21B is a schematic contour-line illustration of a purge gas concentration distribution as the wafer stage 10 has moved most remote from the X-axis laser interferometer 14 and the Y-axis laser interferometer 17, in the exposure operation.

As the air conditioning system 20 is provided, the purge gas flowing outwardly from the cover 9 is driven toward the downstream of the flow, by the flow of a blown gas 21. As a result of this, when the wafer stage 10 becomes closest to the laser interferometers 14 and 17 (FIG. 21A), the purge gas does not flow outwardly into the Y-axis measurement light path 18, such that uneven purge gas concentration does not occur. However, it is seen that uneven purge gas concentration is produced in the X-axis measurement light path 15. When the wafer stage 10 is most away from the laser interferometers 14 and 17 (FIG. 21B), it is seen that uneven purge gas concentration is produced both in the X-axis measurement light path 15 and the Y-axis measurement light path 18. It is seen from the above that, even if the air conditioning system is provided, there occurs a difference in non-uniformness of purge gas concentration in the X-axis measurement light path 15 and the Y-axis measurement light path 18, between when the wafer stage 10 is closest to the laser interferometers 14 and 17 and when it is most remote from them.

This means that, even if the air conditioning system 20 is provided, depending on the position of the wafer stage 10, the refractive index of gas inside the X-axis measurement light path 15 and the Y-axis measurement light path 18 varies. This leads to a measurement error of the laser interferometer, and it causes many defects of produced semiconductor devices and a considerable decrease of productivity of the apparatus.

In order to reduce such a measurement error, as described above, it is necessary to make small the unevenness of the purge gas concentration produced in the X-axis measurement light path 15 and the Y-axis measurement light path 18 and, to attain it, it is necessary to prevent the purge gas from flowing outwardly from the inside of the cover 9 or to reduce the amount of purge gas flow, flowing outwardly from the inside of the cover 9. While FIGS. 20A-21B have been described with reference to examples wherein the cover 9 has a rectangular shape, what has been described above substantially applies to a case wherein the cover has a cylindrical shape or the like.

FIG. 17 described hereinbefore with reference to Japanese Laid-Open Patent Application, Publication No. 2002-513856, is an example wherein gas bearing 215 is produced as purge means. In order that the stage member 203 and the reference member 202 are disposed close to each other with a clearance maintained therebetween, and the substrate W is sealingly placed inside the chamber 204, the gas bearing 215 must be produced to surround the substrate W. This requires a very complicated structure. Thus, a very strict machining precision is required for making the stage member 203, causing difficulty of machine production significantly, and raising the cost.

The exposure apparatus of FIG. 18 described with reference to Japanese Laid-Open Patent Application, Publication No. 2001-210587, is an example wherein, as with the example of FIG. 17, gas bearings 518 and 528 are produced as purge means. In the structure of FIG. 18, purge gases are supplied through orifices 517 and 527 formed at the bottom of the supply channels 511 and 523, whereby gas bearings 518 and 528 are produced. On the other hand, through orifices 519 and 529 formed at the bottom of the exhaust channels 512 and 524, provided outside the supply channels 511 and 523, the purge gases from the gas bearings 518 and 528 are exhausted, by which the atmosphere leaked to below the covers 510 and 520 is prevented from reaching the central region 501. The invention disclosed in this patent document is focused on the provision of gas bearings 518 and 528 to prevent air from reaching the central region 501 from outside of the covers 510 and 520, and the purge gas flowing outwardly from the inside of the covers 510 and 520 is not at all considered. Furthermore, in the structure of FIG. 18, for purging the inside of the cover, the supply channels 511 and 523 have to be provided to approximately surround the central region 501 and, in addition thereto, the exhausted channels 512 and 524 should be provided outside the supply channels. Thus, as with the exposure apparatus of FIG. 17, the structure is very complicated. As a result, a very strict machining precision is required for making the supply channels 511 and 523 and the exhaust channels 512 and 524, significantly increasing the difficulty of machine production, and raising the cost.

It is, therefore, desirable to develop purge means that enables, with a simple structure, prevention of purge gas from flowing outwardly from the inside of the cover, or a reduction of the amount of purge gas flowing outwardly from the inside of the cover.

In the meantime, as described hereinbefore, the impurity concentration inside the cover should be maintained at a level of the ppm order. A simplest structure for purging the inside of the cover would be, as shown in FIG. 16, that a purge gas supply port is provided inside the cover 9 to supply the purge gas therefrom, and that, by blowing the purge gas into the interior of the cover 9, the inside pressure of the cover 9 is made higher than the outside pressure of the cover 9. The higher is the flow rate of purge gas flowing outwardly from the inside of the cover 9, the higher is the inside pressure of the cover 9, and the inside of the cover 9 can be purged more stably.

However, if the amount of purge gas flowing outwardly from the inside of the cover 9 is large, the non-uniformness of purge gas concentration caused in the X-axis measurement light path 15 and the Y-axis measurement light path 18 becomes larger, making the measurement error larger. In order to reduce the measurement error, the purge gas flowing outwardly from the inside of the cover 9 should be prevented or, alternatively, the amount of purge gas flowing outwardly from the inside of the cover 9 should be decreased. Purging the inside of the cover 9 and reducing the measurement error are contradictory to each other, and satisfying both (purging the inside of the cover 9 and reducing the measurement error) simultaneously is not easy to accomplish.

SUMMARY OF THE INVENTION

It is accordingly an object of the present invention to provide an exposure apparatus by which at least one of the problems described above can be solved.

It is another object of the present invention to provide an exposure apparatus by which disturbing substances in a space between a projection optical system and a substrate can be purged while suppressing the outflow of a purge gas from that space.

In accordance with an aspect of the present invention, to achieve the above objects, there is provided an exposure apparatus, comprising a projection optical system for projecting a pattern of an original onto a substrate, a stage for holding the substrate, a cover for substantially surrounding an exposure light path, from an end portion of the projection optical system, at a side facing said stage, to the stage, a first supply port provided inside the cover, for supplying a purge gas into a space surrounded by the cover, and a first exhaust port provided in an end portion of the cover at a side facing the stage, for exhausting the gas.

Briefly, in accordance with the present invention, an exposure apparatus, by which disturbing substances in a space between a projection optical system and a substrate can be purged while suppressing the outflow of a purge gas from that space, is accomplished.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

Embodiment 1

Figure 1:
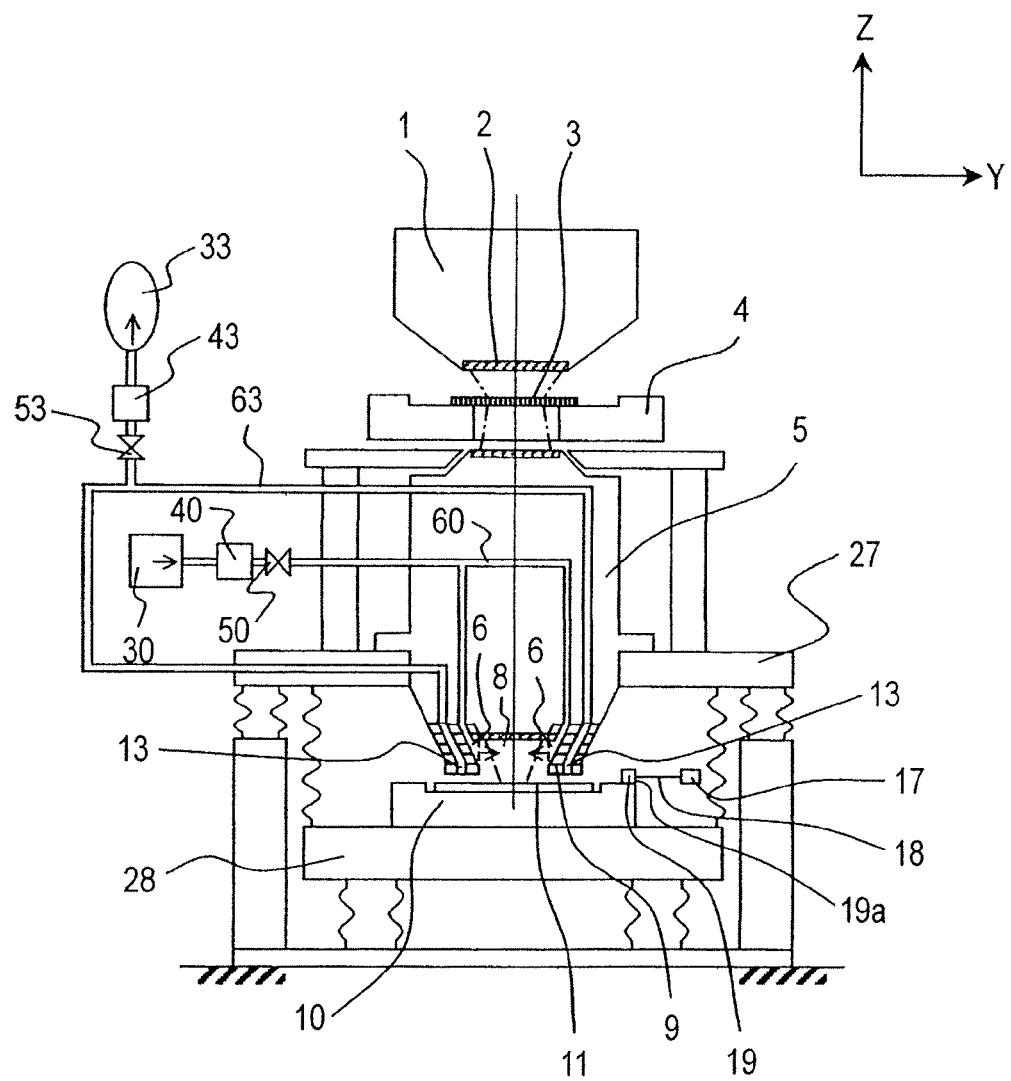
FIG. 1 is a schematic view of a general structure of a projection exposure apparatus according to a first embodiment of the present invention.

FIG. 1 illustrates the structure of a main portion of a step-and-scan type projection exposure apparatus according to an embodiment of the present invention. In FIG. 1, ultraviolet light directed from an unshown ultraviolet light source to an illumination system 1 inside the exposure apparatus illuminates a reticle 3, which is placed on a reticle stage 4. The pattern of the reticle 3 illuminated with light is imaged, in a reduced scale and by a projection optical system 5, upon a photosensitive material having been applied to a wafer 11 placed on a wafer stage 10, whereby the pattern is transferred to the photosensitive pattern.

A cover 9 surrounds the light path of the ultraviolet light, from the wafer side lower end portion of the projection optical system 5 toward the wafer stage 10. Inside the cover 9 is a pair of first supply ports 6 disposed opposed to each other, for blowing a purge gas therethrough. Additionally, at the lower end of the cover 9, there is a first collection port 13 for sucking the purge gas and/or the atmospheric gas, wherein the collection port extends to surround the outer periphery of an exposure area. Here, as regards the purge gas, an inactive (inert) gas such as nitrogen, helium, argon, and so on, may be used. Depending on the amount of collection at the first collection port 13, it is possible that the atmosphere outside the cover 9 is collected through the first collection port 13. In this sense, the first collection port 13 may be described as having a function for sucking the purge gas and/or the atmospheric gas, as has just been described above. In the following description, for simplicity, the first collection port 13 will be described as collecting the purge gas. However, the "purge gas" to be mentioned may include the atmosphere outside the cover 9, not only the purge gas supplied from the first supply port 6.

In the structure of FIG. 1, a purge gas is supplied from a purge gas supplying device 30 and through a pipe 60, into the inside of the cover 9 from the first supply port 6. There is a flow rate controller 40, which is provided between the purge gas supplying device 30 and the first supply port 6, such that the purge gas can be supplied into the inside of the cover 9 at a flow rate corresponding to control data from a main control system (not shown). There is a vacuum pump 33 provided in association with the first collection port 13, for collecting the purge gas through a pipe 63. A flow rate controller 43 is provided between the first collection port 13 and the vacuum pump 33, such that the purge gas can be collected through the first collection port 13 at a flow rate corresponding to control data from the main control system. Here, the flow rate controllers 40 and 43 control valves 50 and 53, respectively, to open and close them at a predetermined timing on the basis of control data from the main control system.

Figure 19:
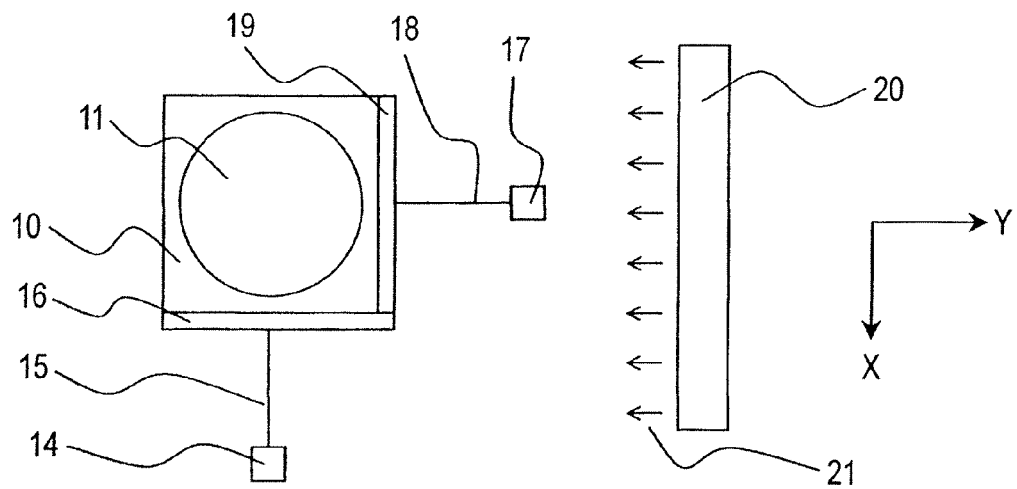
FIG. 19 is a schematic and plan view for explaining an X-Y positioning system.

In FIG. 1, denoted at 17 is a Y-axis laser interferometer, and denoted at 18 is a Y-axis measurement light path. Denoted at 19 is a Y-axis measurement mirror fixedly mounted on the wafer stage 10. While not shown in FIG. 1, there are similar elements provided with respect to the X direction, such as shown in FIG. 19, that is, X-axis laser interferometer 14, X-axis measurement light path 15 and X-axis measurement mirror 16 fixedly mounted on the wafer stage 10, for measuring the position with respect to the X direction. In FIG. 1, denoted at 2 is a sheet glass, and denoted at 8 is the flow of purge gas. Denoted at 27 is a base table for the projection optical system, and denoted at 28 is a base table for the wafer stage.

In the exposure apparatus of FIG. 1, light emitted from a laser interferometer light source (not shown) is introduced into the Y-axis laser interferometer 17. The light introduced into the Y-axis interferometer 17 is divided by a beam splitter (not shown) provided inside the Y-axis interferometer 17, into light which is directed to a fixed mirror (not shown) inside the interferometer and light which is directed to the Y-axis measurement mirror 19. The light directed toward the mirror 19 goes along the Y-axis measurement light path 18 and it impinges on the Y-axis measurement mirror 19 fixedly mounted on the wafer stage 10, and the light is reflected by the reflection surface 19a of the mirror. Here, the reflected light again goes back along the Y-axis measurement light path 18 and returns to the beam splitter inside the Y-axis interferometer 17, such that it is superposed with the light reflected by the fixed mirror. Here, by detecting a change in interference of the light, the movement distance in the Y direction can be measured. The movement distance in the X direction can be measured similarly to the Y-axis measurement. The information on the movement distance detected in this manner is fed back to an X-Y driving system (not shown), and the positioning control of the wafer stage 10 is carried out on the basis of it.

In the exposure apparatus of FIG. 1, for purging the inside of the cover 9, first, the main control system (not shown) applies a control signal to the flow rate controller 40 to open the valve 50, whereby a purge gas is supplied into the inside of the cover 9 through the first supply port 6, at a predetermined flow rate. Subsequently, a control signal is applied to the flow rate controller 43 to open the valve 53, whereby the purge gas is collected through the first collection port 13, at a predetermined flow rate.

Here, the purge gas is supplied into the inside of the cover 9 through the first supply port 6 at a predetermined flow rate, so as to assure that in the exposure operation the impurity concentration inside the cover 9 is made lower than a desired level, that is, the inside of the cover 9 is purged. Although the flow rate of purge gas necessary for purging the inside of the cover 9 is different in dependence upon the shape of the cover 9 or the magnitude of the clearance between the cover 9 and the wafer 11, if the cover 9 has a rectangular shape and the clearance between the cover 9 and the wafer 11 is 1.5 mm, the inside of the cover 9 can be purged by supplying a purge gas from the first supply port at a flow rate not greater than 1 smlm (standard liter/min). As regards the flow rate necessary for purging the inside of the cover 9, it may be determined beforehand in the manner that: in a state in which the purge gas is not collected through the first collection port 13, the impurity concentration inside the cover 9 is measured while changing the supply flow rate from the first supply port, and the flow rate as a desired impurity concentration (or lower) is reached is chosen. Alternatively, it may be determined on the basis of simulations.

Next, in the exposure apparatus of FIG. 1, wherein the first collection port 13 is provide so as to surround the outer periphery of the exposure area, the pressure inside the cover 9 and the pressure outside the cover 9, as well as the purge gas concentration distribution near the wafer stage 10, will be explained.

Figure 2A:
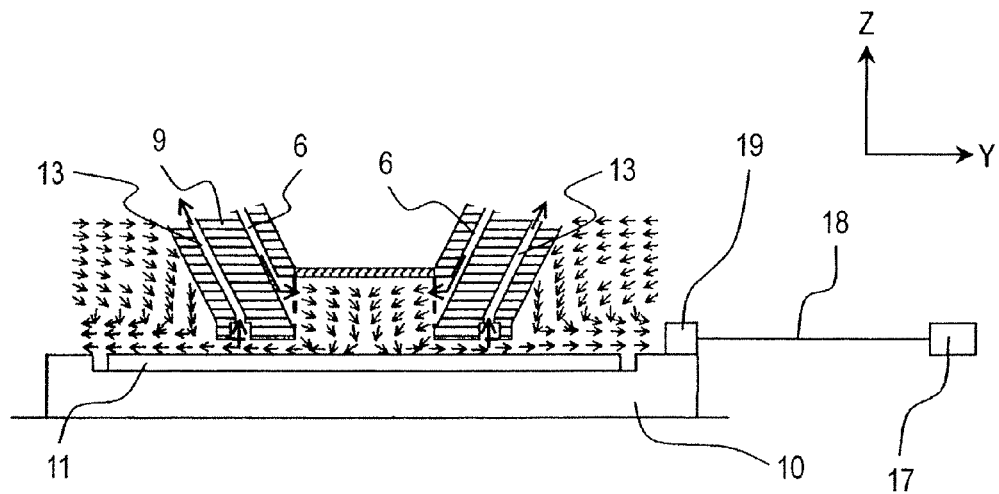
FIGS. 2A and 2B are schematic views, respectively, for explaining the flow and the pressure distribution of a purge gas around a wafer, in the exposure apparatus of FIG. 1.
Figure 2B:
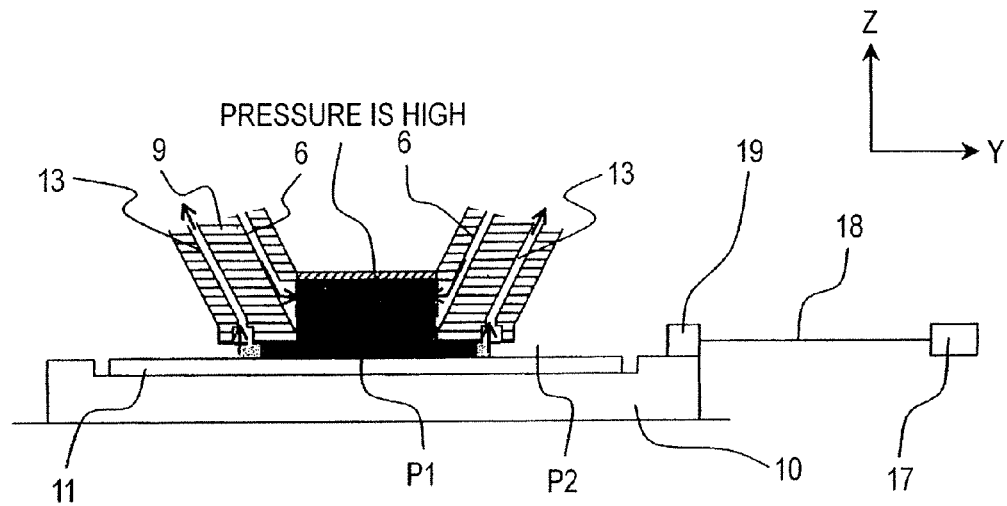

Initially, referring to FIGS. 2A, 2B, 3A and 3B, a description will be made of a case wherein the flow rate control is made so that the flow rate of the purge gas to be supplied through the first supply port 6 becomes larger than the flow rate of the purge gas collected through the first collection port 13. FIG. 2A is a schematic illustration, showing the flow inside the cover 9 along a central sectional plane. FIG. 2B is a schematic isobaric illustration for the pressure distribution in the same plane as that of FIG. 2A. In the isobaric illustration of FIG. 2B, the darker the color is, the higher the pressure is, and the lighter the color is, the lower the pressure is. If the flow rate of the purge gas supplied through the first supply port 6 is greater than the flow rate of purge gas collected through the first collection port 13, as shown in FIG. 2A, a portion of the purge gas supplied from the first supply port 6 is collected by the first collection port, while the remainder flows outwardly of the cover 9. As a result, as shown in FIG. 2B, the pressure P1 inside the cover 9 becomes higher than the pressure P2 outside the cover 9, such that the inside of the cover 9 can be purged.

Figure 3A:
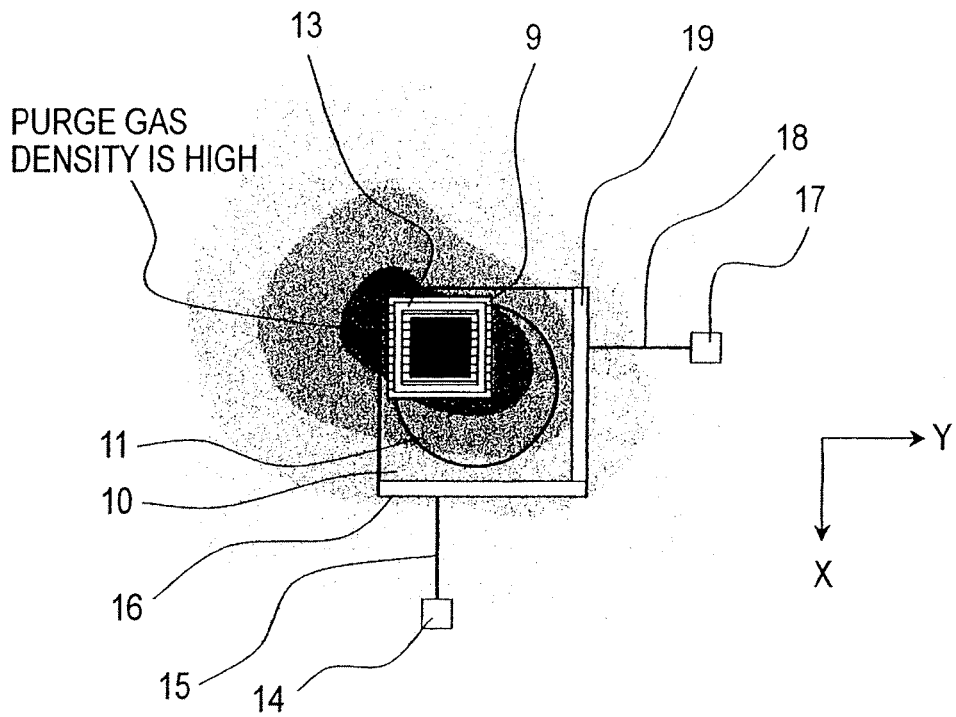
FIGS. 3A and 3B are schematic illustrations of a purge gas concentration distribution around a wafer stage, in the exposure apparatus of FIG. 1.
Figure 3B:
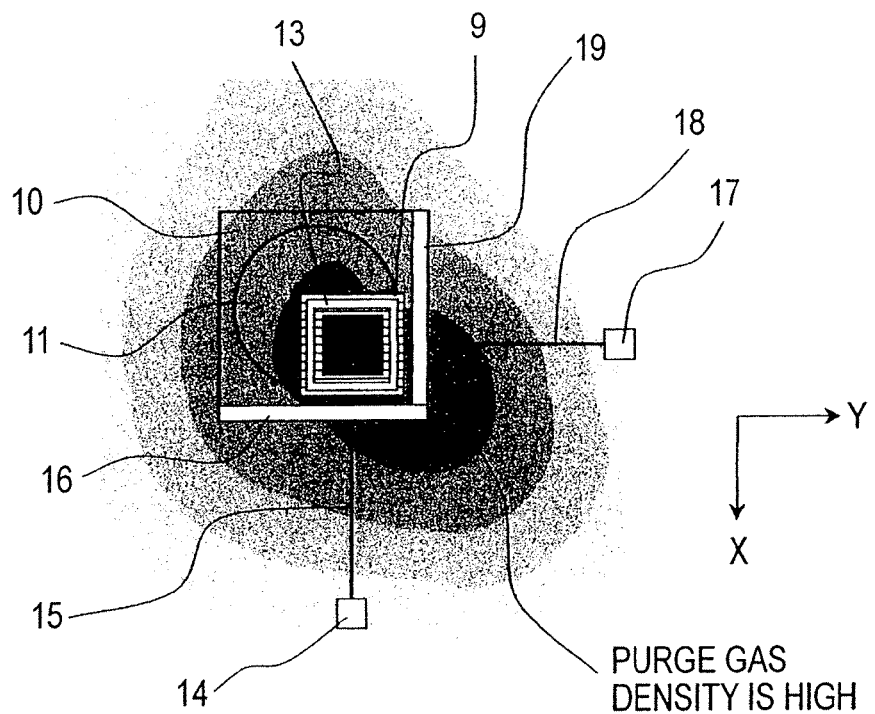
Figure 20A:
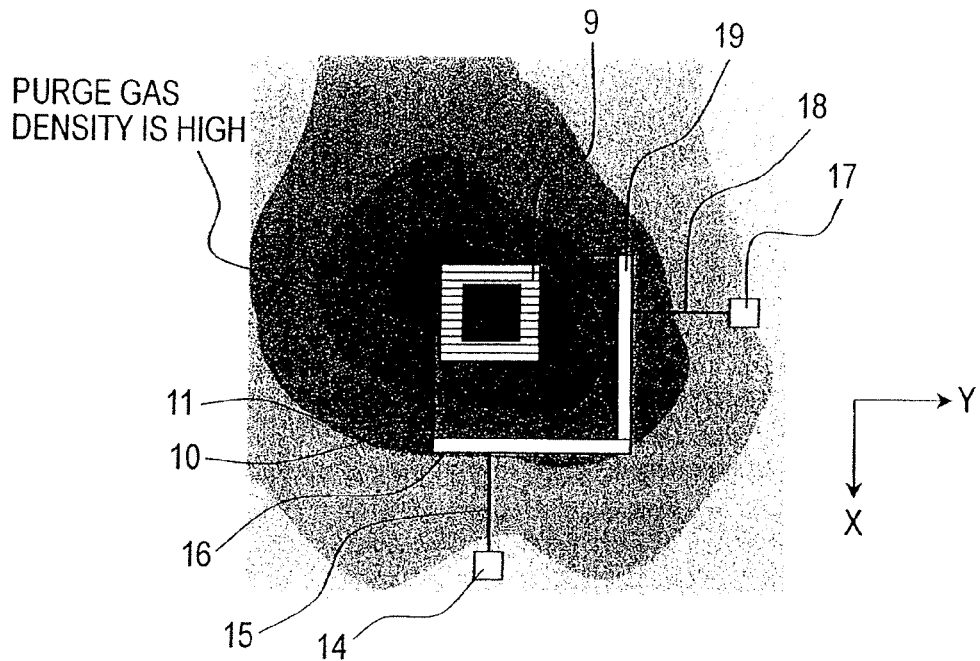
FIGS. 20A and 20B are schematic illustrations of a purge gas concentration distribution around a wafer stage, wherein the X-Y positioning system of FIG. 19 is used.
Figure 20B:
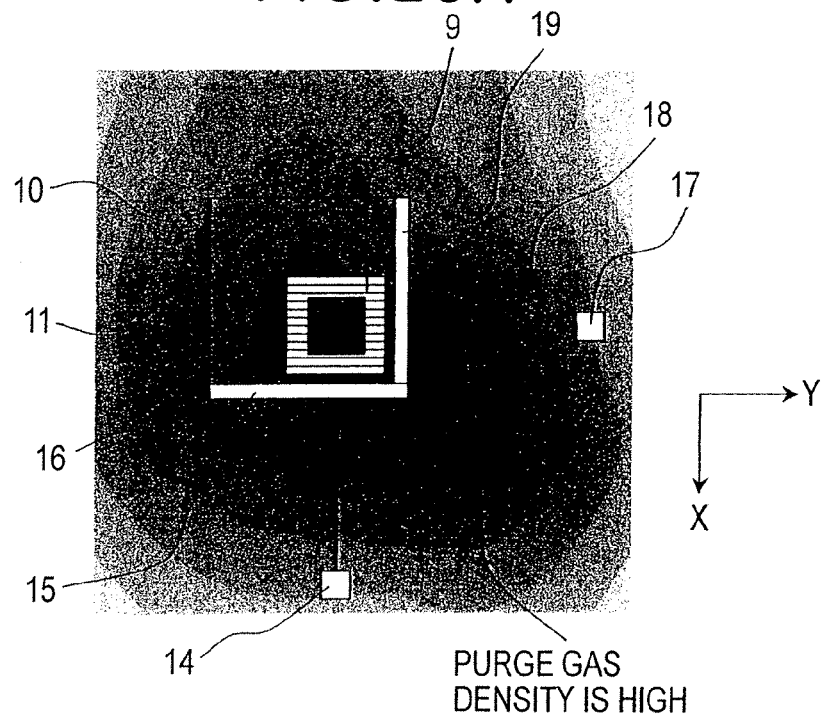
Figure 21A:
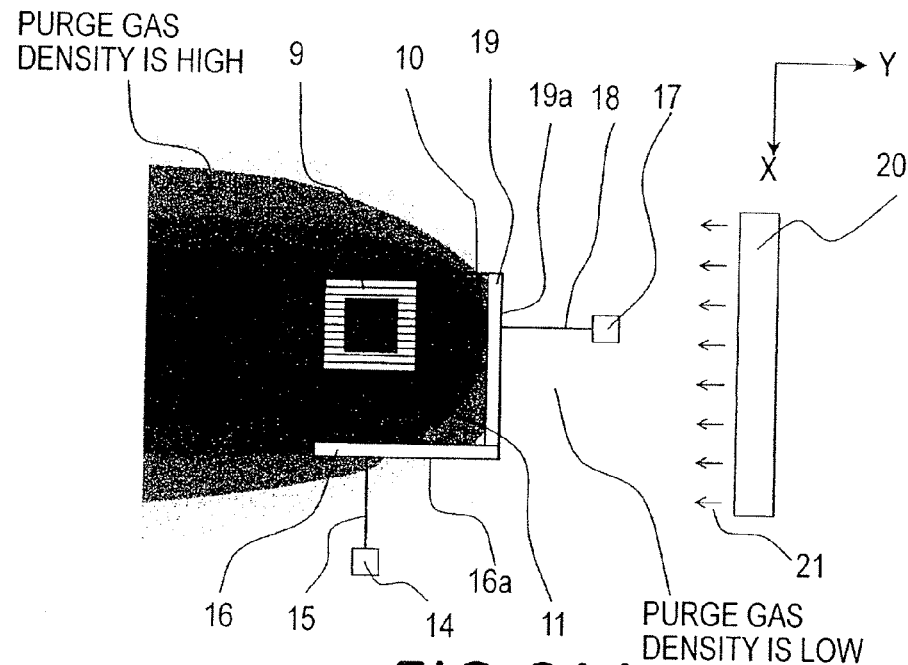
FIGS. 21A and 21B are schematic illustrations of a purge gas concentration distribution around a wafer stage, wherein an air conditioning system is used.
Figure 21B:
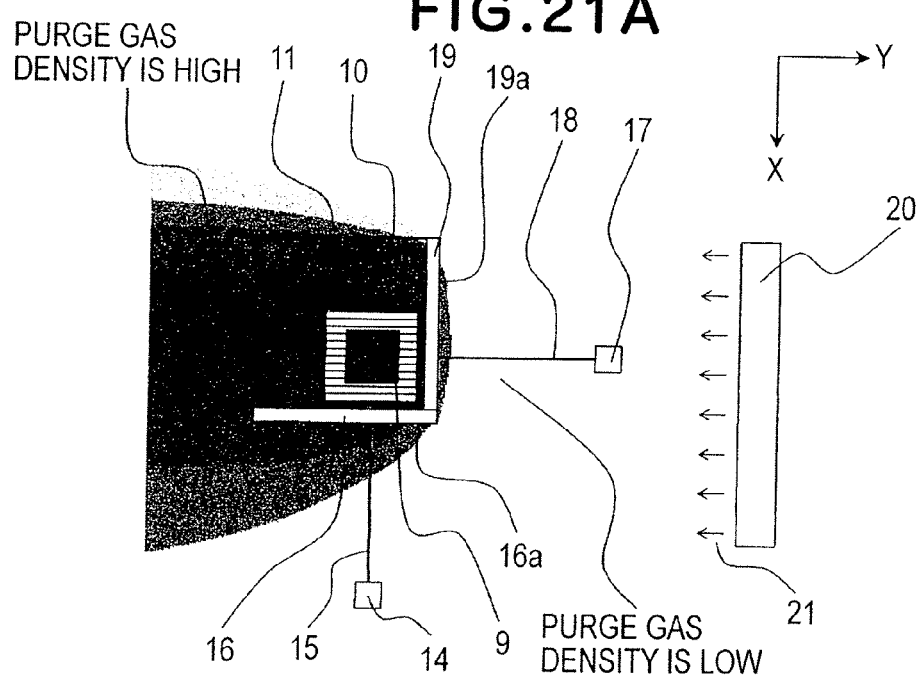

FIG. 3A is a schematic isosbesticline chart of a purge gas concentration distribution as the wafer stage has moved closest to the X-axis laser interferometer 14 and the Y-axis laser interferometer 17 in the exposure operation. FIG. 3B is a schematic isosbestic-line chart of the purge gas concentration distribution as the wafer stage 10 has moved most remote from the X-axis laser interferometer 14 and the Y-axis laser interferometer 17 in the exposure operation. In these isosbestic-line charts, the darker the color is, the higher the purge gas concentration is, and the lighter the color is, the lower the purge gas concentration is. Since a portion of the purge gas supplied through the first supply port 6 is collected by the first collection port 13, the flow rate of purge gas flowing outwardly of the cover 9 can be reduced. Thus, it is seen that, in both of the case (FIG. 3A) wherein the wafer stage 10 comes closest to the interferometers 14 and 17 and the case (FIG. 3B) wherein the stage has moved most remote from the interferometers, the non-uniformness of purge gas concentration in the X-axis measurement light path 15 and the Y-axis measurement light path 18 is reduced significantly as compared with a case (FIG. 20) wherein the first collection port 13 is not provided. Hence, the measurement error to be produced in the laser interferometer can be reduced significantly.

As described above, if the flow rate of purge gas supplied through the first supply port 6 is greater than the flow rate of purge gas collected by the first collection port 13, the pressure P1 inside the cover 9 becomes higher than the pressure P2 outside the cover 9, and as a result, the inside of the cover 9 can be purged. Moreover, the flow rate of purge gas flowing outwardly from the cover 9 can be reduced and, thus, the measurement error of the laser interferometer can be reduced.

Next, referring to FIGS. 4A, 4B, 5A and 5B, a description will be made of a case wherein the flow rate control is made so that the flow rate of purge gas to be collected by the first collection port 13 becomes larger than the flow rate of purge gas to be supplied through the first supply port 6. In this case, depending on the collecting flow rate of the purge gas collected by the first collection port 13, it is possible that the pressure P1 inside the cover 9 becomes lower than the pressure P2 outside the cover 9. Here, a case wherein the pressure P1 inside the cover 9 is lower than the pressure P2 outside the cover 9 will be explained.

Figure 4A:
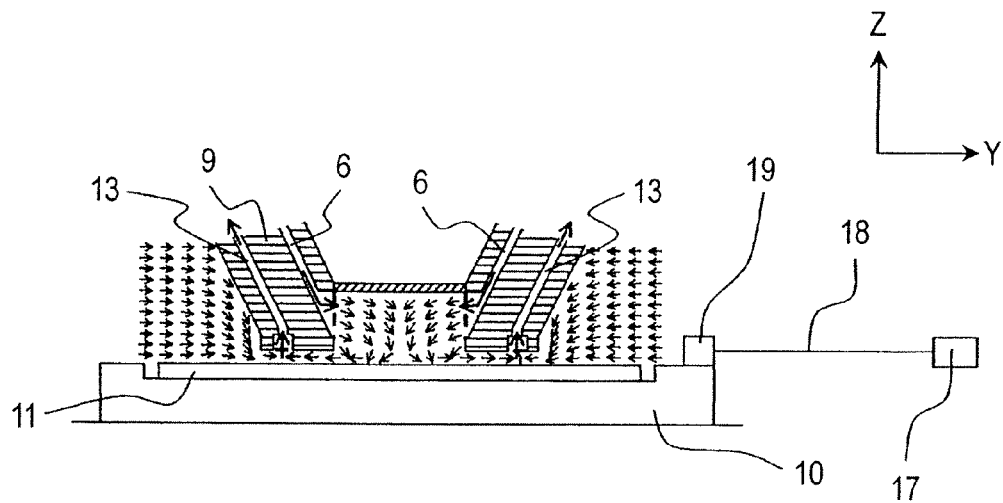
FIGS. 4A and 4B are schematic views, respectively, for explaining the flow and the pressure distribution of a gas around a wafer, in the exposure apparatus of FIG. 1.
Figure 4B:
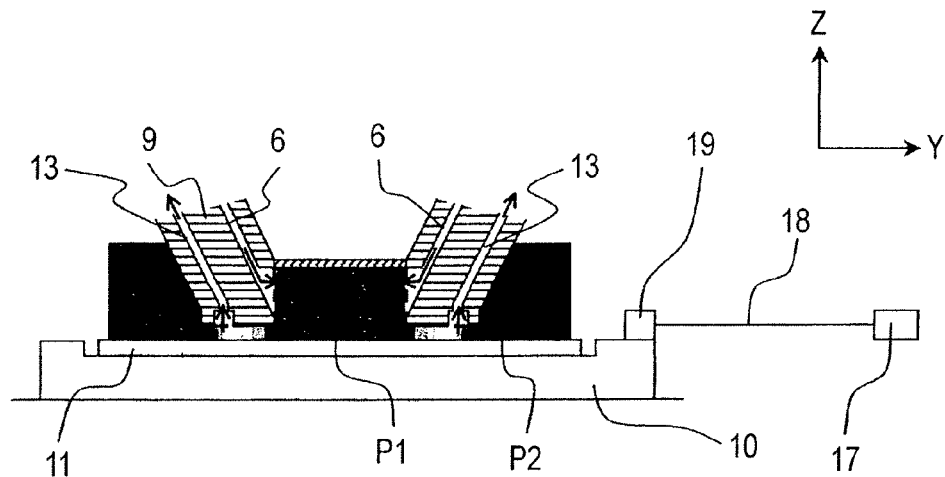

FIG. 4A is a schematic view of the flow inside the cover 9 along a central sectional plane. FIG. 4B is a schematic isobaric illustration of a pressure distribution in the same plane as that of FIG. 4A. In the isobaric illustration of FIG. 4B, the darker the color is, the higher the pressure is, and the lighter the color is, the lower the pressure is. If the flow rate of purge gas collected by the first collection port 13 is larger than the flow rate of purge gas supplied through the first supply port 6, as shown in FIG. 4A, a flow of purge gas flowing from the inside of the cover 9 toward the first collection port 13 and a flow of atmosphere flowing from outside the cover 9 toward the first collection port 13 are produced. If the flow rate of atmosphere flowing from the outside of the cover 9 to the collection port 13 is large, as shown in FIG. 4B, the pressure P1 inside the cover 9 becomes lower than the pressure P2 outside the cover 9.

However, it should be noted here that, in the region around the cover 9, the portion having a lowest pressure is an area near the first collection port 13. For this reason, even if the pressure P1 inside the cover 9 is lower than the pressure P2 outside the cover 9, there still is a flow of purge gas flowing from inside the cover 9 toward the collection port 13. As a result, inflow of atmosphere into the cover 9 from outside the cover, flowing across the collection port 13, can be avoided and, thus, the inside of the cover 9 can be purged.

Figure 5A:
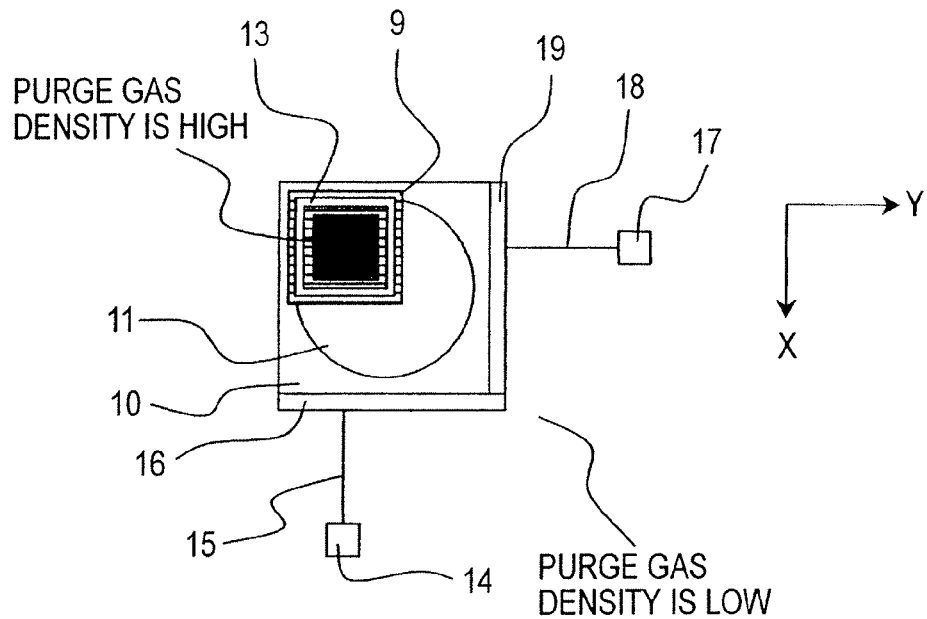
FIGS. 5A and 5B are schematic illustrations of a purge gas concentration distribution around a wafer stage, in the exposure apparatus of FIG. 1.
Figure 5B:
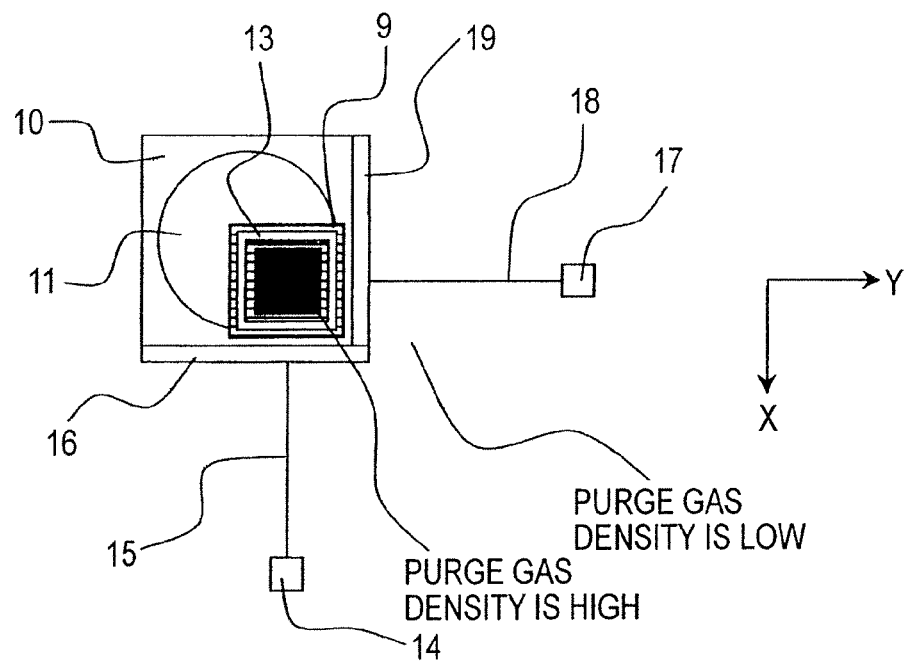

FIG. 5A is a schematic isosbesticline chart of a purge gas concentration distribution as the wafer stage 10 has moved closest to the X-axis laser interferometer 14 and the Y-axis laser interferometer 17 in the exposure operation. FIG. 5B is a schematic isosbestic-line chart of the purge gas concentration distribution as the wafer stage 10 has moved most remote from the X-axis laser interferometer 14 and the Y-axis laser interferometer 17 in the exposure operation. In these isosbestic-line charts, the darker the color is, the higher the purge gas concentration is, and the lighter the color is, the lower the purge gas concentration is. A white color depicts a zone where no purge gas is present. The purge gas supplied through the first supply port 6 is all collected by the first collection port 13. Therefore, the purge gas does not flow outwardly of the cover 9. Thus, it is seen that, in both of the case (FIG. 5A) wherein the wafer stage 10 comes closest to the interferometers 14 and 17 and the case (FIG. 5B) wherein the stage has moved most remote from the interferometers, there is no uneven purge gas concentration in the X-axis measurement light path 15 and the Y-axis measurement light path 18. Hence, the measurement error of the laser interferometer can be prevented.

As described above, in the exposure apparatus of FIG. 1, wherein a first collection port 13 is provided so as to surround the outer periphery of the exposure area, since the purge gas supplied through the first supply port 16 is collected by the first collection port 13, the flow rate of purge gas flowing outwardly of the cover 9 from the inside of the cover can be reduced. Therefore, an uneven purge gas concentration produced in the X-axis measurement light path 15 and the Y-axis measurement light path 18 can be made small, and the measurement error of the laser interferometer can be reduced significantly.

Furthermore, in order to avoid non-uniformness of a purge gas concentration in the X-axis measurement light path 15 and the Y-axis measurement light path 18 to thereby prevent measurement error of the laser interferometer, the flow rate control should desirably be made so that the flow rate of purge gas to be collected by the first collection port 13 becomes larger than the flow rate of purge gas to be supplied through the first supply port 6. Here, depending on the flow rate of purge gas collected by the collection port 13, it is possible that the pressure P1 inside the cover 9 becomes lower than the pressure P2 outside the cover 9. However, as described hereinbefore, even in such a case, the inside of the cover 9 can be purged. Furthermore, if, in this case, the collecting flow rate through the collection port 13 is too large, it may be possible that the flow velocity of atmosphere flowing toward the first collection port 13 from outside the cover 9 becomes fast and the atmosphere flows into the inside of the cover 9. Although the collecting flow rate through the first collection port in the case wherein the atmosphere flows into the cover 9 is different in dependence upon the shape of the cover 9 or the size of clearance between the cover 9 and the wafer 11, if, for example, the cover 9 has a rectangular shape and the clearance between the cover 9 and the wafer 11 is 1.5 mm, the atmosphere will not flow into the cover 9 as long as the collecting flow rate through the first collection port 13 is not greater than five times the supplying flow rate through the first supply port 6. As regards the upper limit of the collecting flow rate through the collection port 13, it may be determined beforehand in the manner that: the impurity concentration inside the cover 9 is measured while changing the collection flow rate through the collection port 13, and the flow rate as a desired impurity concentration (or lower) is reached is chosen. Alternatively, it may be determined on the basis of simulations. Then, the collection flow rate through the collection port 13 may be controlled so that the collection flow rate through the collection port is maintained to be not greater than the upper limit so determined beforehand.

In the exposure apparatus of FIG. 1, as described above, with a very simple structure that a first supply port 6 is provided inside the cover 9 and a first collection port 13 is provided at a lower end portion of the cover 9 so as to surround the outer periphery of the exposure area, it is assured to purge the inside of the cover 9, such that a measurement error of the laser interferometer can be prevented effectively.

Modified Example of Embodiment 1

Figure 6:
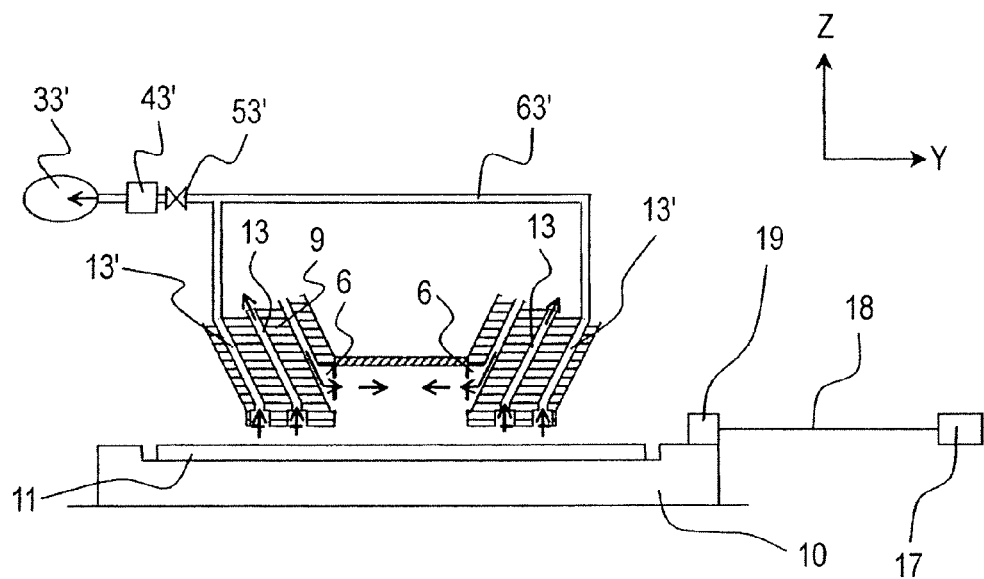
FIG. 6 is a schematic view of a general structure of a projection exposure apparatus according to a modified form of the first embodiment of the present invention.

In the exposure apparatus of the first embodiment, a single first collection port 13 is provided at the lower end of the cover 9 so as to surround the outer periphery of the exposure area. However, a couple of collection ports may be provided. With such a dual structure, the influence applied from outside the cover 9 to inside the cover 9 can be reduced more. FIG. 6 is a schematic view of an exposure apparatus, and it shows an example wherein a second collection port 13' is provided outside the first collection port 13. Since the FIG. 6 embodiment is a modified form of the first embodiment, only the structural portion around the cover 9 is illustrated there. In FIG. 6, like numerals as those of FIG. 1 are assigned to corresponding components.

In FIG. 6, there is a vacuum pump 33' provided in association with the second collection port 13', for collecting the purge gas through a pipe 63'. A flow rate controller 43' is provided between the second collection port 13' and the vacuum pump 33', such that the purge gas can be collected through the second collection port 13' at a flow rate corresponding to control data from a main control system (not shown). Here, the flow rate controller 43' controls a valve 53' to open and close it at a predetermined timing on the basis of control data from the main control system.

In the exposure apparatus of the first embodiment (FIG. 1), in order to prevent outflow of the purge gas from the cover 9, the flow rate of purge gas collected by the first collection port 13 should be made larger than the flow rate of purge gas supplied through the first supply port 6. In the modified embodiment of FIG. 6, on the other hand, it is sufficient that the total flow rate of purge gas as collected by the first collection port 13 and the second collection port 13' is larger than the flow rate of purge gas supplied through the first collection port 6. Here, referring to FIG. 7, a description will be made of the flow of gas near the cover 9 in a case wherein the flow rate of purge gas collected by the first collection port 13 is smaller than the flow rate of purge gas supplied through the first supply port 6, while the total flow rate of purge gas collected by the first and second collection ports 13 and 13' is larger than the flow rate of purge gas supplied through the first supply port 6.

Figure 7:
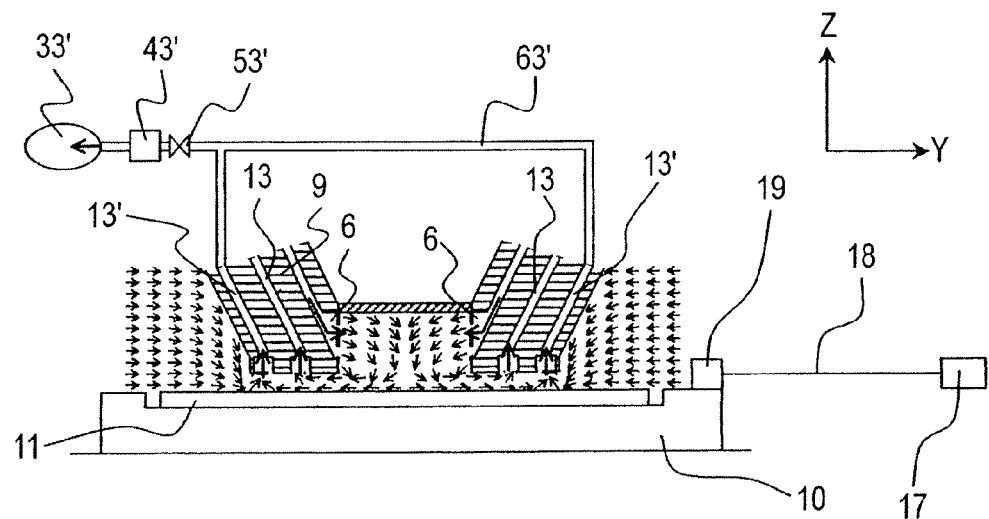
FIG. 7 is a schematic view for explaining the flow of a gas around a wafer, in the exposure apparatus of FIG. 6.

FIG. 7 is a schematic view of the flow of gas inside the cover 9 and along a central sectional plane. As shown in FIG. 7, since the flow rate of purge gas collected by the first collection port 13 is smaller than the flow rate of purge gas supplied through the first supply port 6, a portion of the purge gas supplied by the first supply port 6 is not collected by the first collection port 13, and it forms a flow directed outwardly of the cover 9. Due to this flow, the pressure P1 inside the cover 9 is increased to a similar level as the pressure P1 inside the cover 9, as illustrated in FIG. 2B. The purge gas not collected by the first collection port 13 is collected by means of the second collection port 13'. Thus, there occurs no uneven purge gas concentration around the wafer stage and, therefore, a measurement error of the laser interferometer can be avoided.

In the structure of FIG. 6, the structure of the cover 9 is somewhat complicated. However, with the provision of dual collection ports described above, the pressure P1 inside the cover 9 can be maintained at a high level and, furthermore, the measurement error of the laser interferometer can be prevented. These advantageous results are obtainable at once, in this structure.

In the exposure apparatus of the first embodiment, the first collection port 13 is provided at the lower end of the cover 9 so as to 25 surround the outer periphery of the exposure area. However, depending on the disposition of various units constituting the exposure apparatus, there may be cases wherein the first collection port 13 cannot be provided to surround the outer periphery of the exposure area. For example, if a focus sensor of an oblique light incidence type is provided to detect the height (level) of the wafer surface, measurement light will be projected from one direction inside the cover 9, while a position sensor such as a CCD or PSD will be used at the other side to detect reflection light. In such a case, it is difficult to provide the first collection port 13 across the light path of the measurement light. Therefore, the collection port will have to be provided in a portion of the lower end of the cover 9. Even on such an occasion, however, since the purge gas can be collected by the first collection port 13, the flow rate of purge gas flowing outwardly of the cover 9 can be reduced, and thus, non-uniformness of purge gas concentration to be produced around the wafer stage 10 can be reduced significantly.

If the first collection port 13 is provided in a portion of the lower end of the cover 9, in order to purge the inside of the cover 9, the pressure P1 inside the cover 9 should be made higher than the pressure P2 outside the cover 9. To this end, the flow rate control is made so that the flow rate of purge gas supplied through the first supply port 6 becomes larger than the flow rate of purge gas collected by the first collection port 13.

In the flow rate control described above, a first pressure sensor 81 for measuring the pressure inside the cover 9 and a second pressure sensor 82 for measuring the pressure outside the cover 9 may be provided. The flow rate of purge gas to be supplied through the first supply port 6 and/or the flow rate of purge gas to be collected through the first collection port 13 may be controlled on the basis of the measurements made by the sensors 81 and 82, so that the pressure P1 inside the cover 9 becomes higher than the pressure P2 outside the cover 9.

For example, when an oblique light incidence type focus sensor is provided with respect to the X direction, the first collection port 13 may be provided before and after the exposure area with respect to the X direction. On that occasion, a single pressure sensor may be provided inside the cover 9 as the first pressure sensor 81 for measuring the pressure P1 inside the cover 9, while a single pressure sensor may be provided outside the cover 9 as the second pressure sensor 82 for measuring the pressure outside the cover 9. Then, the flow rate of purge gas to be supplied through the first supply port 6 may be controlled on the basis of the measurements made by the sensors 81 and 82, so that the pressure P1 inside the cover 9 becomes higher than the pressure P2 outside the cover 9.

If, for example, the pressure P2 outside the cover 9 becomes higher than the inside pressure P1 thereof due to a transitional pressure change resulting from a large change in atmospheric pressure outside the exposure apparatus, the main control system operates to increase the flow rate of purge gas supplied through the first supply port 6. In response, the pressure P1 inside the cover 9 rises and it becomes higher than the outside pressure P2, and thus, the inside of the cover 9 can be purged. Here, as a matter of course, a plurality of pressure sensors may be provided inside and outside the cover 9 to measure the pressure at a plurality of points with these pressure sensors and, on the basis of the measurement results, the flow rate of purge gas supplied through the first supply port 6 and/or the flow rate of purge gas collected by the first collection port 13 may be controlled. With the measurements at plural points, the inside of the cover 9 can be purged more stably.

When a first collection port 13 is provided at a lower end of a cover 9 so as to surround the outer periphery of the exposure area as in the exposure apparatus of the first embodiment, as a matter of course, such pressure sensor means may be provided adjacent to the first collection port 13 so that the supply flow rate through the supply port 16 and/or the collection flow rate through the collection port 13 may be controlled to ensure that the pressure adjacent to the collection port 13 becomes higher than the inside pressure of the cover 9. Use of such pressure sensor means and the flow rate control method described above will be applicable also to exposure apparatuses according to Embodiments 2-5 to be described later.

In the exposure apparatus of the first embodiment, the outside of the cover 9 is at the atmosphere. There may be cases wherein the outside of the cover 9 is purged by use of a purge gas having a higher impurity concentration as compared with the purge gas supplied into the cover 9, thereby to reduce the impurity concentration outside the cover 9. On such an occasion, as well, unevenness of purge gas concentration will occur in the X-axis measurement light path 15 and the Y-axis measurement light path 18, causing a measurement error of the laser interferometer. The exposure apparatus according to the first embodiment is obviously applicable even to such a case. This is also the case with exposure apparatuses to be described later with reference to Embodiments 2, 4 and 5.

Embodiment 2

Figure 8A:
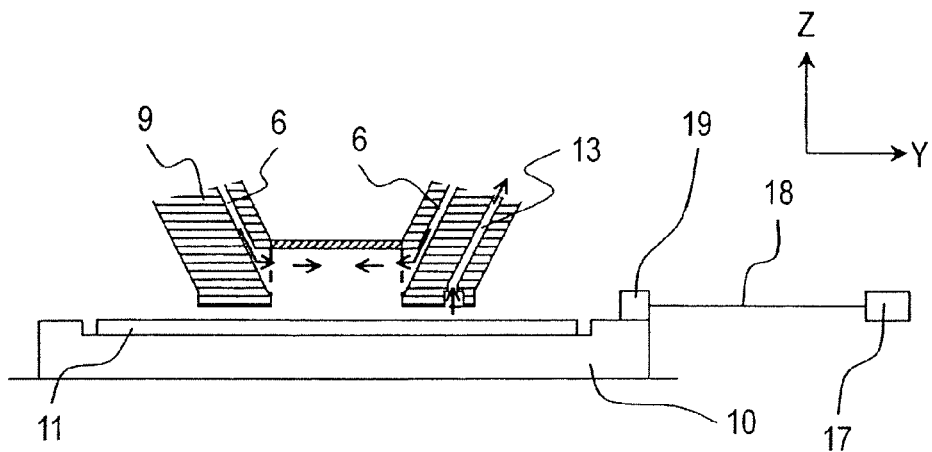
FIGS. 8A and 8B are schematic views, respectively, of a general structure of a projection optical system, around a wafer, according to a second embodiment of the present invention.
Figure 8B:
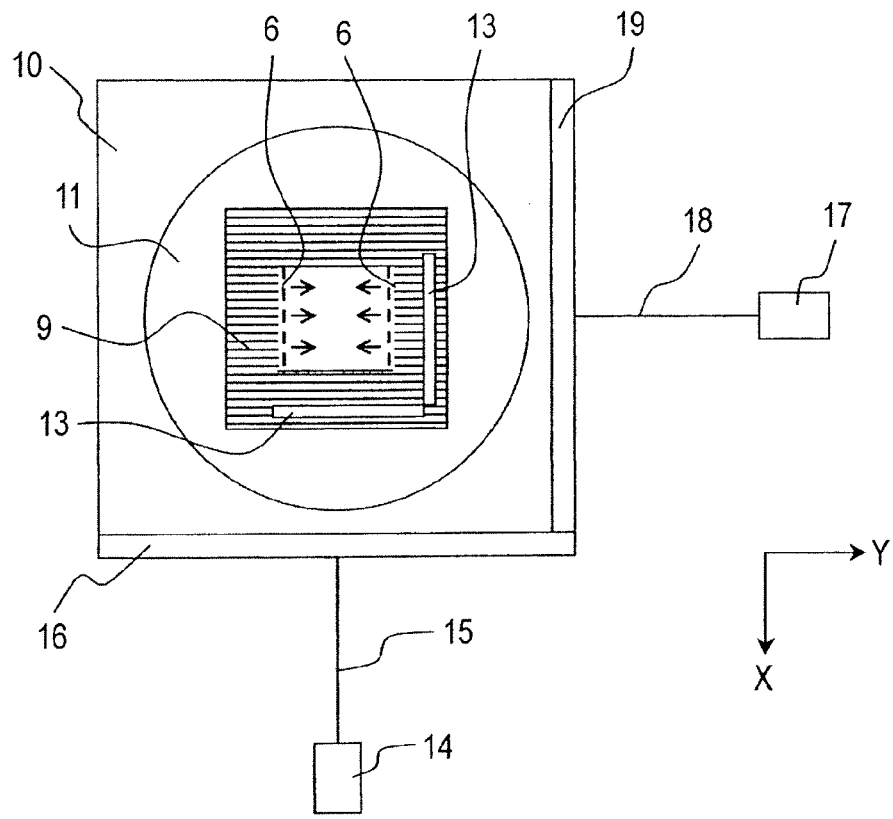

FIGS. 8A and 8B show the structure around a wafer stage of an exposure apparatus according to a second embodiment of the present invention. In the first embodiment, the first collection port 13 is provided at the lower end of the cover 9 so as to surround the four sides of the outer periphery of the exposure area. On the other hand, the second embodiment is an example wherein a collection port 13 is provided only at two sides of the lower end of the cover, adjacent to an X-axis measurement mirror 16 and a Y-axis measurement mirror 19, respectively.

In FIG. 8A, which is a sectional view and FIG. 8B, which is a plan view, like numerals as those of FIG. 1 are assigned to corresponding components. The flow rate control method and the wafer stage 10 positioning method are similar to those described with reference to the first embodiment, and a duplicate description of them will be omitted here.

In the exposure apparatus of the second embodiment, for purging the inside of the cover 9, first, a main control system (not shown) applies a control signal to a flow rate controller 40 to open a valve 50, whereby a purge gas is supplied into the inside of the cover 9 through the first supply port 6, at a predetermined flow rate. Subsequently, a control signal is applied to a flow rate controller 43 to open a valve 53, whereby the purge gas is collected through the first collection port 13, at a predetermined flow rate. Here, the flow rate control is made so that the flow rate of purge gas supplied through the first supply port 6 becomes larger than the flow rate of purge gas collected by the first collection port.

Figure 9A:
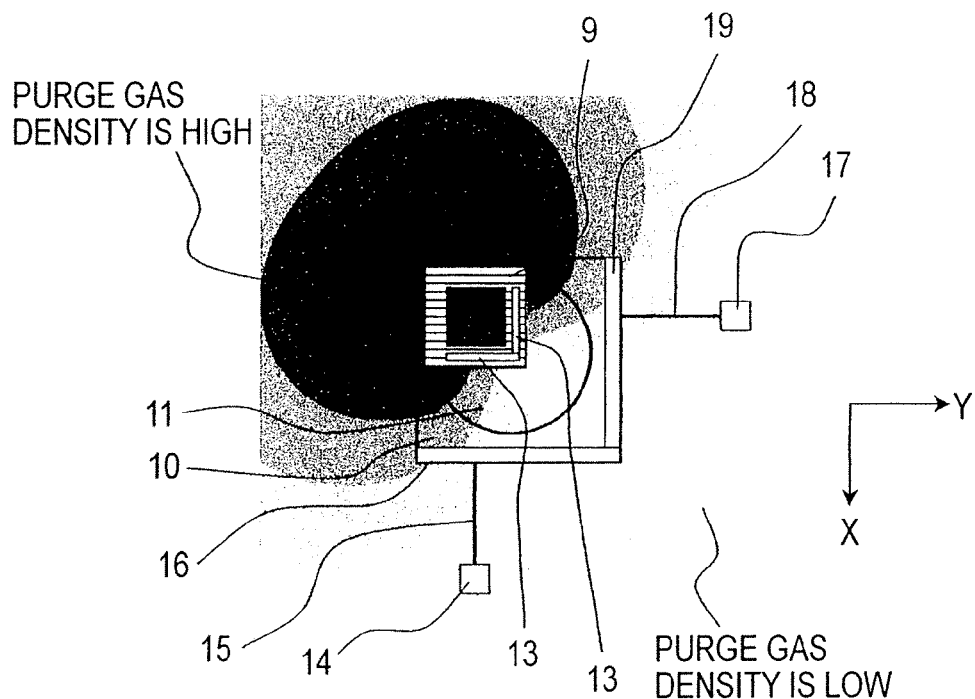
FIGS. 9A and 9B are schematic illustrations of a purge gas concentration distribution around a wafer stage, in the exposure apparatus of FIGS. 8A and 8B.
Figure 9B:
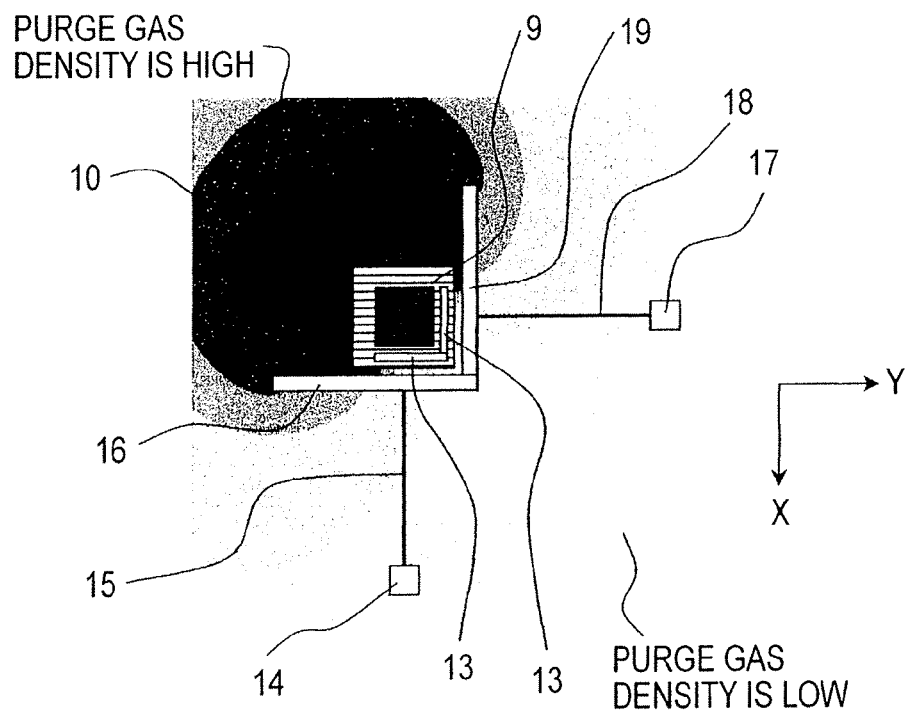

In the exposure apparatus of the second embodiment, the first collection port 13 is provide only at the two sides at the lower end of the cover, facing the X-axis measurement mirror 16 and the Y-axis measurement mirror 19, respectively. Therefore, as shown in FIGS. 9A and 9B, the flow rate of purge gas flowing out into the X-axis measurement light path 15 and the Y-axis measurement light path 18 can be reduced and, thus, the measurement error of the laser interferometer can be reduced significantly.

In the exposure apparatus of the second embodiment, as described above, with a very simple structure that a first collection port 13 is provided at a lower end portion of the cover 9, adjacent to the X-axis measurement mirror 16 and the Y-axis measurement mirror 19, it is assured to purge the inside of the cover 9, such that a measurement error of the laser interferometer can be prevented effectively.

Embodiment 3

Figure 10A:
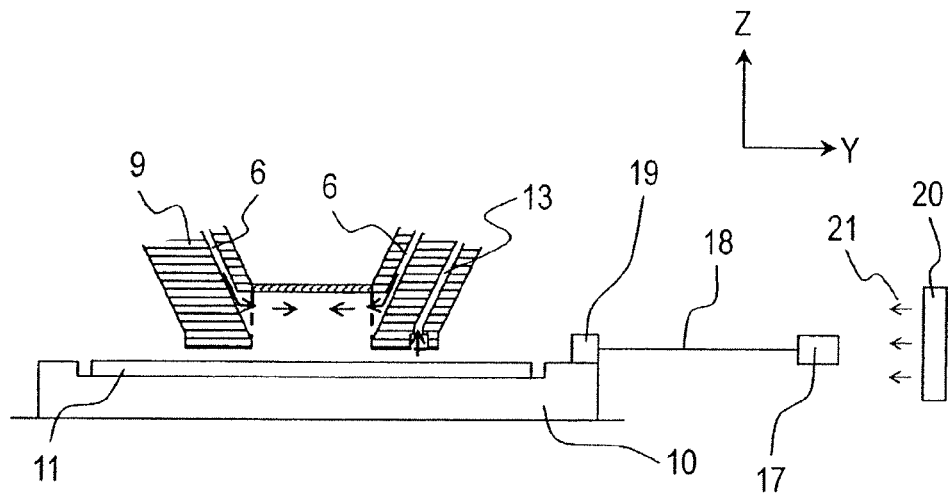
FIGS. 10A and 10B are schematic views, respectively, of a general structure of a projection optical system, around a wafer, according to a third embodiment of the present invention.
Figure 10B:
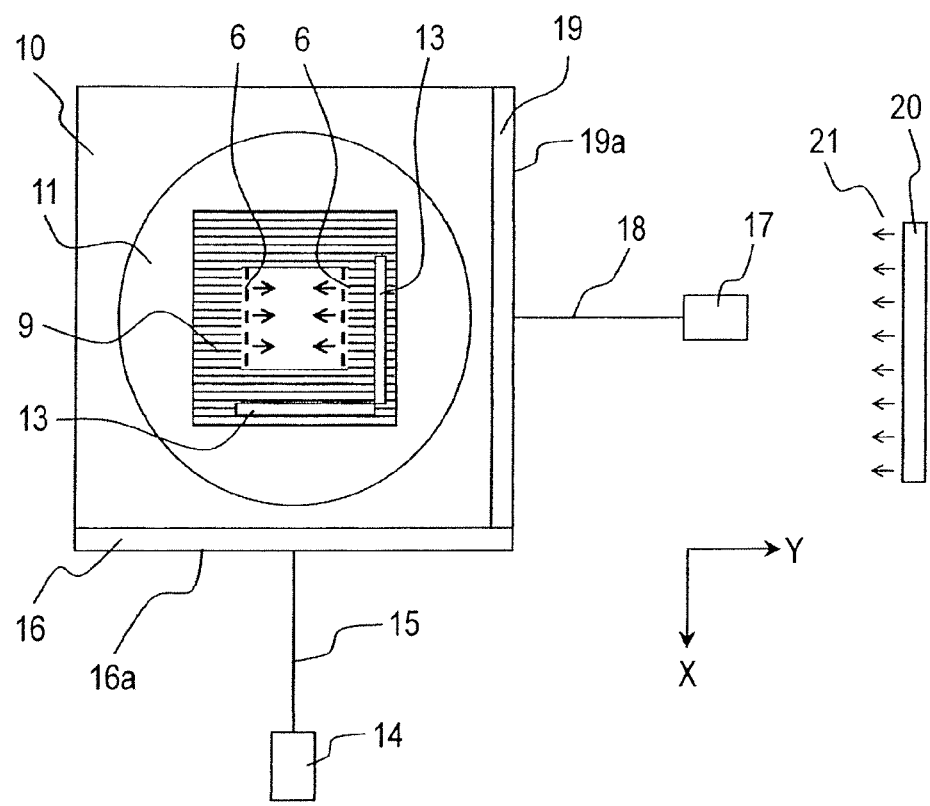

FIGS. 10A and 10B are schematic views, respectively, of the structure of a main portion of an exposure apparatus according to a third embodiment of the present invention. In the second embodiment, a collection port 13 is provided in the lower end portion of the cover, adjacent to the X-axis measurement mirror 16 and the Y-axis measurement mirror 19. The third embodiment is an example wherein an air conditioning system 20, as well, is provided to blow a gas toward a position opposed to the reflection surface 19a of a Y-axis measurement mirror 19, such that, by means of this air conditioning unit 20, a temperature controlled blow gas 21 is blown around the wafer stage. Here, the blown gas 21 may be air or a purge gas having an impurity concentration higher than that of the purge gas supplied through into the cover 9.

With this arrangement, the total flow rate of inactive gas used in the exposure apparatus can be made smaller, such that the cost for operating the apparatus can be made cheaper.

In FIG. 10A, which is a sectional view and FIG. 10B, which is a plan view, like numerals as those of FIG. 8 are assigned to corresponding components. The flow rate control method and the cover 9 inside purging method, as well as the wafer stage 10 positioning method are similar to those described with reference to the first and second embodiments, and a duplicate description of them will be omitted here.

In the exposure apparatus of the third embodiment, the air conditioning system 20 is provided at a position opposed to the reflection surface 19a of the Y-axis measurement mirror 19. However, the air conditioning system 20 may be provided at a position facing the reflection surface 16a of the X-axis measurement mirror 16. Similar advantageous results as those in the third embodiment are obtainable even with such a structure.

In the exposure apparatus of the third embodiment as described above, with a very simple structure that an air conditioning system 20 is provided at a position opposed to the reflection surface 19a of the Y-axis measurement mirror 19 or the reflection surface 16a of the X-axis measurement mirror 16, in addition to the structure of the second embodiment, it is assured to purge the inside of the cover 9 and a measurement error of the laser interferometer can be prevented effectively.

Embodiment 4

The first to third embodiments have been described with reference to a purging method for purging the inside of the cover 9, in which a first supply port 6 is provided oppositely to supply a purge gas into the cover 9. However, there are many known methods usable to purge the inside of the cover 9, and this embodiment is applicable to any of these methods. For example, the assignee of the subject application has proposed various methods in Japanese Patent Application No. 2003-53892, in relation to purging the inside of a cover by causing a purge gas to flow in one direction inside the cover. The purging methods disclosed in Japanese Patent Application No. 2003-53892 are all applicable to the exposure apparatuses of the first to third embodiments.

Figure 12:
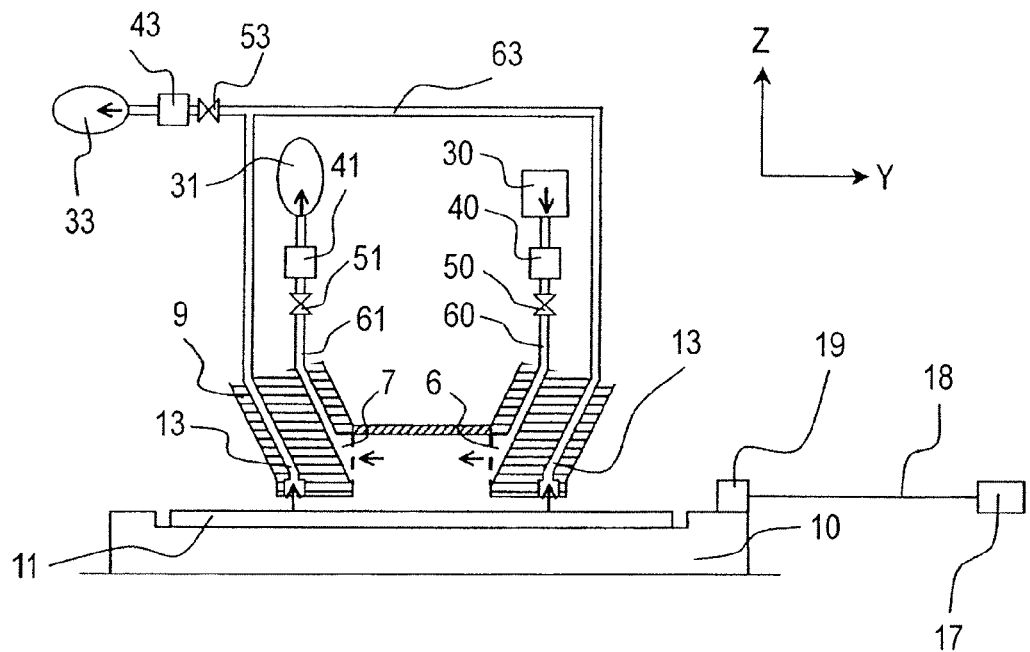
FIG. 12 is a schematic view of a general structure of a projection optical system, around a wafer, according to a fourth embodiment of the present invention.

For example, FIG. 12 shows an example wherein one purging method disclosed in Japanese Patent Application No. 2003-53892 is applied to the exposure apparatus of the first embodiment described above. Except for a change in the purging method for purging the inside of the cover 9, this example is essentially the same as that of the first embodiment, and only the structural portion around the cover 9 is illustrated schematically in FIG. 12. Also, in FIG. 12, like numerals as those of FIG. 1 are assigned to corresponding components. Since the flow rate control has been described with reference to the first embodiment, a duplicate explanation will be omitted here.

In FIG. 12, there is a vacuum pump 31 provided in association with a third collection port 7, for collecting the purge gas inside the cover 9 through a pipe 61. A flow rate controller 41 is provided between the third collection port 7 and the vacuum pump 31, such that the purge gas can be collected through the third collection port 7 at a flow rate corresponding to control data from a main control system, not shown. Here, the flow rate controller 41 controls a valve 51 to open and close it at a predetermined timing on the basis of control data supplied from the main control system.

In the structure of FIG. 12, the first supply port 16 for supplying a purge gas is provided at one side of the interior of the cover 9 while the third collection port 7 for collecting the purge gas is provided at the other side, and this corresponds to the structure disclosed in Japanese Patent Application No. 2003-53892. With this structure, it is assured that, inside the cover 9, the purge gas flows in one direction. Therefore, even if various products (degassing) are generated during the exposure process due to a photosensitive material applied to the wafer surface, they can be collected efficiently and, thus, contamination of the surface of optical elements can be avoided effectively.

In accordance with Japanese Patent Application No. 2003-53892, the flow rate of purge gas collected by the third collection port 7 is made smaller than the flow rate of purge gas supplied by the first supply port 6, by which the purge gas is caused to flow outwardly from the inside of the cover 9 and the pressure P1 inside the cover 9 is made larger than the pressure P2 outside the cover 9, and by which the inside of the cover 9 is purged.

In the exposure apparatus of the first embodiment, the collection flow rate of purge gas collected by the first collection port 13 is made larger than the supply flow rate of purge gas supplied through the first supply port 6, by which outflow of the purge gas outwardly of the cover 9 is prevented and uneven purge gas concentration around the wafer stage 10 is avoided, and by which a measurement error of the laser interferometer is prevented.

In consideration of this, in the exposure apparatus of the fourth embodiment, the flow rate control is carried out so that the flow rate of purge gas collected by the third collection port 7 becomes smaller than the flow rate of purge gas supplied through the first supply port 6 and also that the total flow rate of purge gas collected by the first collection port 13 and the third collection port 7 becomes larger than the flow rate of purge gas supplied through the first supply port 6.

Figure 18:
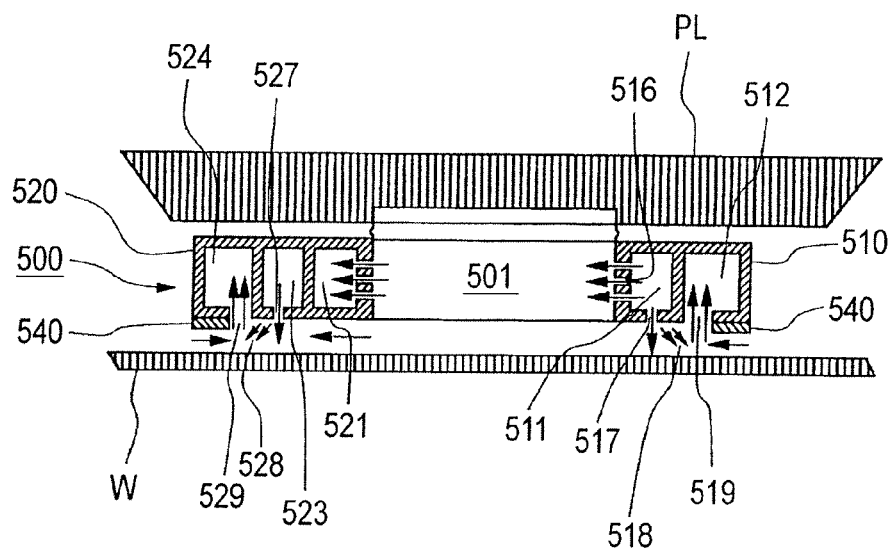
FIG. 18 is a schematic view of a further example of a known type of exposure apparatus having purge means.

As described, the flow rate of purge gas collected by the third collection port 7 is made smaller than the flow rate of purge gas supplied through the first supply port 6, and, by doing so, a flow of purge gas directed from the inside of the cover 9 to the first collection port 13, which is provided to surround the outer periphery of the exposure area, is created. As a result, inflow of atmosphere into the cover 9 from outside the cover, flowing across the first collection port 13, can be avoided. Therefore, the inside of the cover 9 can be purged with a much simpler structure, without the necessity of orifices 517 and 527 provided at the bottom of the supply channels 511 and 523 in the conventional structure shown in FIG. 18.

Furthermore, the total flow rate of purge gas collected by the first collection port 13 and the third collection port 7 is made larger than the flow rate of purge gas supplied through the first supply port 6. By doing so, outflow of the purge gas outwardly from the inside of the cover 9 can be prevented. As a result, uneven purge gas concentration around the wafer stage can be avoided and thus a measurement error of the laser interferometer can be prevented effectively.

The fourth embodiment described above is an example wherein one purging method disclosed in Japanese Patent Application No. 2003-53892 is applied to the exposure apparatus of the first embodiment. However, it may be applied to the exposure apparatus according to the second embodiment or the third embodiment. On that occasion, since the first collection port 13 is provided at the lower end of the cover, adjacent to the X-axis measurement mirror 16 and the Y-axis measurement mirror 19, for purging the inside of the cover 9, the flow rate control should be made so that the pressure P1 inside the cover 9 becomes higher than the pressure P2 outside the cover 9. To this end, for purging the inside of the cover 9, the total flow rate of purge gas to be collected by the first and third collection ports 13 and 7 should be controlled to be lower than the flow rate of purge gas supplied by the first supply port 16.

Embodiment 5

A fifth embodiment of the present invention is an example (FIG. 13) in which another purging method as disclosed in Japanese Patent Application No. 2003-53892, different from the one applied to the fourth embodiment, is applied to an exposure apparatus according to the first embodiment.

Figure 13:
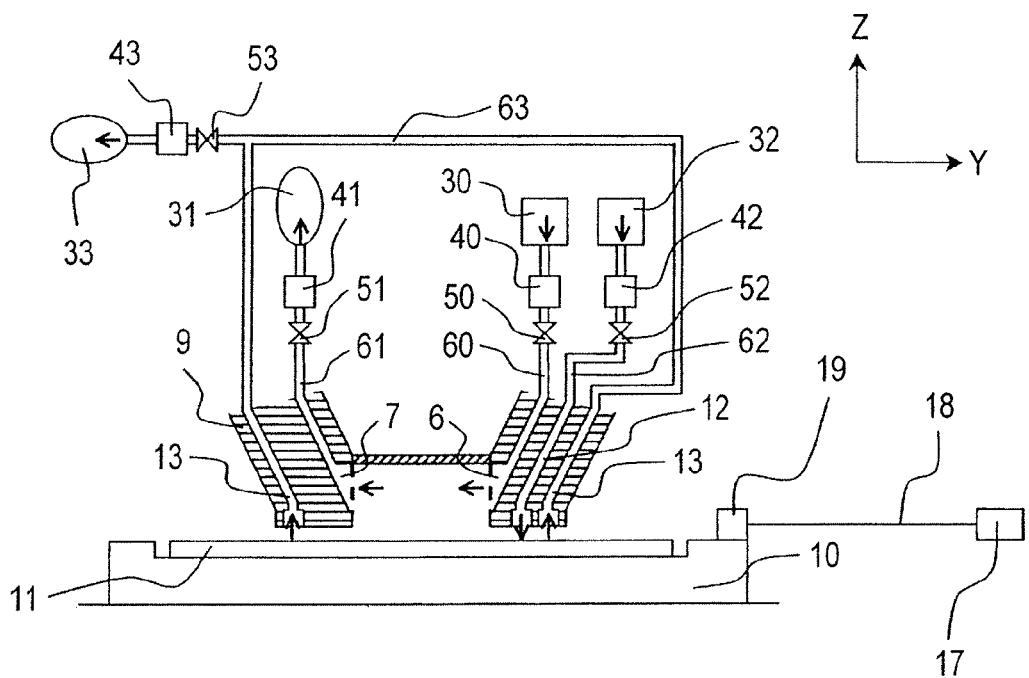
FIG. 13 is a schematic view of a general structure of a projection optical system, around a wafer, according to a fifth embodiment of the present invention.

In FIG. 13, like numerals as those of FIGS. 1 and 12 are assigned to corresponding components. The flow rate control is essentially 25 the same as that made in the first or fourth embodiment, and a duplicate explanation will be omitted here.

In FIG. 13, there is a second supply port 12 which is provided at a lower end of the cover adjacent to the first supply port 6, and inside the first collection port 13. A purge gas supplying system 32 is provided in association with the second supply port 12, through a pipe 62, such that a purge gas can be supplied from the second supply port 12 toward a wafer at a predetermined flow rate. There is a flow rate controller 42 between the second supply port 12 and the purge gas supplying system 32, and a purge gas can be supplied from the second supply port 12 toward the wafer at a flow rate corresponding to control data from a main control system, not shown. The flow rate controller 42 controls a valve 52 to open and close the same at a predetermined timing on the basis of a control signal from the main control system.

In the structure of FIG. 13, the first supply port 6 for supplying a purge gas is provided at one side of the interior of the cover 9, while the third collection port 7 for collecting the purge gas is provided at the other side, and additionally, the second supply port 12 is provided at the lower end of the cover adjacent to the first supply port 6 (the first collection port 13 is not provided). This corresponds to the structure disclosed in Japanese Patent Application No. 2003-53892. As compared with the structure of the fourth embodiment (FIG. 12), the second supply port 12 is provided at the lower end of the cover, adjacent to the first supply port 6. This effectively prevents production of whirls near the area below the first supply port 6. Thus, as compared with the structure without the second supply port 12, the inside of the cover 9 can be purged more stably.

In accordance with Japanese Patent Application No. 2003-53892, the flow rate of purge gas collected by the third collection port 7 is made smaller than the total flow rate of purge gas supplied by the first and second supply ports 6 and 12, by which the purge gas is caused to flow outwardly from the inside of the cover 9 and the pressure P1 inside the cover 9 is made larger than the pressure P2 outside the cover 9, and by which the inside of the cover 9 is purged.

In the exposure apparatus of the first embodiment, the collection flow rate of purge gas collected by the first collection port 13 is made larger than the supply flow rate of purge gas supplied through the first supply port 6, by which outflow of the purge gas outwardly of the cover 9 is prevented, and uneven purge gas concentration around the wafer stage 10 is avoided, and by which a measurement error of the laser interferometer is prevented.

In consideration of this, in the exposure apparatus of the fifth embodiment, the flow rate control is carried out so that the flow rate of purge gas collected by the third collection port 7 becomes smaller than the total flow rate of purge gas supplied through the first and second supply ports 6 and 12, and also that the total flow rate of purge gas collected by the first collection port 13 and the third collection port 7 becomes larger than the total flow rate of purge gas supplied through the first and second supply ports 6 and 12.

As described, the flow rate of purge gas collected by the third collection port 7 is made smaller than the total flow rate of purge gas supplied through the first and second supply ports 6 and 12, and, by doing so, a flow of purge gas directed from the inside of the cover 9 to the first collection port 13, which is provided to surround the outer periphery of the exposure area, is created. As a result, inflow of atmosphere into the cover 9 from outside the cover, flowing across the first collection port 13, can be avoided. Furthermore, the second supply port 12 is provided so as to prevent formation of whirls near the area below the first supply port 6. Therefore, the inside of the cover 9 can be purged with a much simpler structure, without the necessity of orifices 517 and 527 provided at the bottom of the supply channels 511 and 523 in the conventional structure shown in FIG. 18.

Moreover, the total flow rate of purge gas collected by the first collection port 13 and the third collection port 7 is made larger than the total flow rate of purge gas supplied through the first and second supply ports 6 and 12. By doing so, outflow of the purge gas outwardly from the inside of the cover 9 can be prevented. As a result, uneven purge gas concentration around the wafer stage can be avoided and thus, a measurement error of the laser interferometer can be prevented effectively.

The fifth embodiment described above is an example wherein one purging method disclosed in Japanese Patent Application No. 2003-53892 is applied to the exposure apparatus of the first embodiment. However, it may be applied to the exposure apparatus according to the second embodiment or the third embodiment. On that occasion, since the first collection port 13 is provided at the lower end of the cover, adjacent to the X-axis measurement mirror 16 and the Y-axis measurement mirror 19, for purging the inside of the cover 9, the flow rate control should be made so that the pressure P1 inside the cover 9 becomes higher than the pressure P2 outside the cover 9. To this end, for purging the inside of the cover 9, the total flow rate of purge gas to be collected by the first and third collection ports 13 and 7 should be controlled to be lower than the total flow rate of purge gas supplied by the first and second supply ports 6 and 12.

The fourth and fifth embodiments of the present invention described above are examples in which two purging methods, as disclosed in Japanese Patent Application No. 2003-53892, are applied to an exposure apparatus according to the first, second and third embodiments. Japanese Patent Application No. 2003-53892 mentions further purging methods which are usable to purge the inside of the cover 9, and they may be applied to the exposure apparatus of the first to third embodiments of the present invention.

The first to fifth embodiments described above use a vacuum pump for collecting the purge gas or atmospheric gas through the first or third collection port. It should be noted here that, regarding such a vacuum pump, a vacuum pump of the type without pulsation (pressure variation) may desirably be used in the sense that it applies no adverse influence to the purging performance. For example, a vacuum pump of a scroll type or a vacuum ejector that produces a vacuum by use of a pressurized gas will be preferable. Alternatively, a reservoir may be used to suppress the pulsation.

In accordance with the embodiments of the present invention described hereinbefore, in an exposure apparatus using ultraviolet light, particularly, ArF excimer laser light or fluorine ($F_2$) excimer laser light, the inside of the exposure light path near a wafer can be purged stably without being influenced externally and, additionally, non-uniformness of purge gas concentration around the wafer stage can be reduced effectively. As a result, the manufacturing cost of the exposure apparatus can be reduced, yet sufficient transmissivity as well as uniformness and stability of the ArF excimer laser light or fluorine ($F_2$) excimer laser light are accomplished. Furthermore, the positioning of the wafer stage can be carried out very precisely. Therefore, projection exposure can be done very precisely and, thus, a fine circuit pattern can be projected satisfactorily.

The present invention is not limited to the exposure apparatuses of the foregoing embodiments. The present invention is applicable also to any exposure apparatuses arranged to project a pattern of a mask onto a photosensitive substrate through a projection optical system, particularly, one that uses ultraviolet light as exposure light. There is no restriction in regard to the ultraviolet light which is suitably usable in the exposure apparatus as exposure light. However, as described in the introductory portion of this specification, the present invention is particularly effective when used with deep ultraviolet light, more specifically, ArF excimer laser light having an emission wavelength of about 193 nm or a fluorine ($F_2$) excimer laser having an emission wavelength of about 157 nm.

Embodiment 6

Next, an embodiment of a device manufacturing method, which uses an exposure apparatus described above, will be explained.

Figure 14:
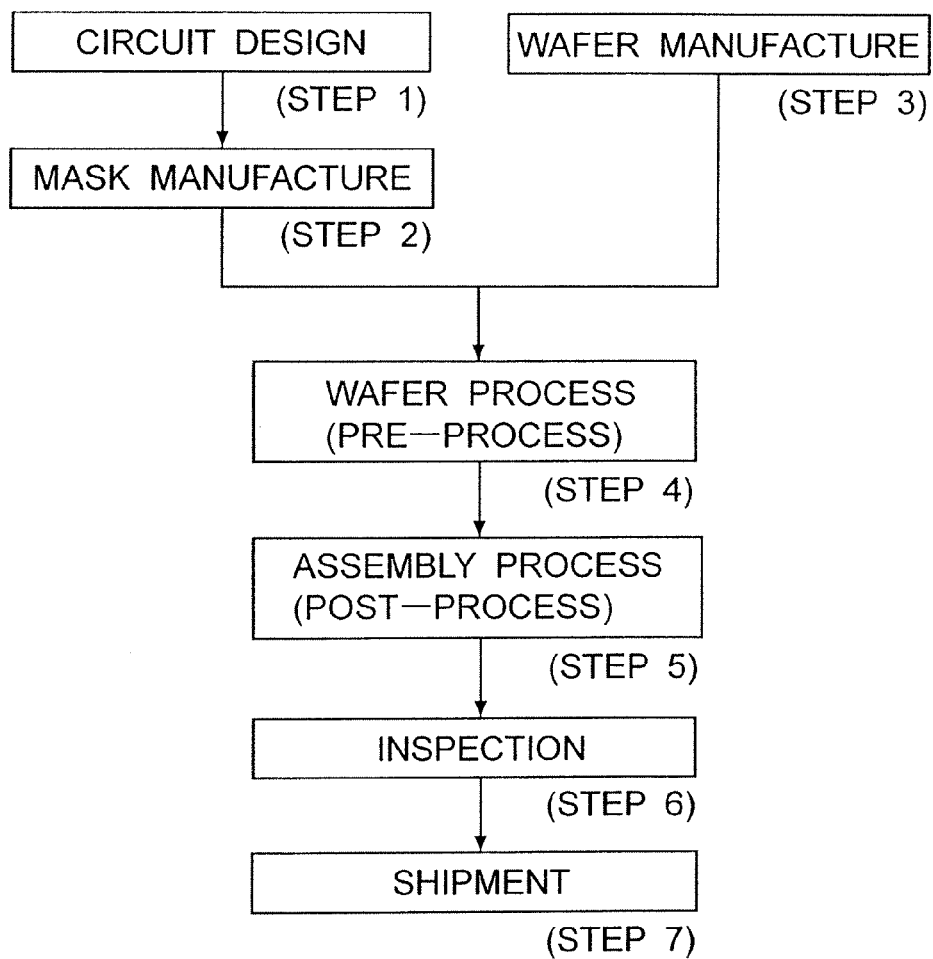
FIG. 14 is a flow chart for explaining the procedure of device manufacturing processes.

FIG. 14 is a flow chart for explaining the procedure of manufacturing various microdevices such as semiconductor chips, (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5 subsequent to this is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check and so on, for the semiconductor devices produced by step 5, are carried out. With these processes, semiconductor devices are produced, and they are shipped (step 7).

Figure 15:
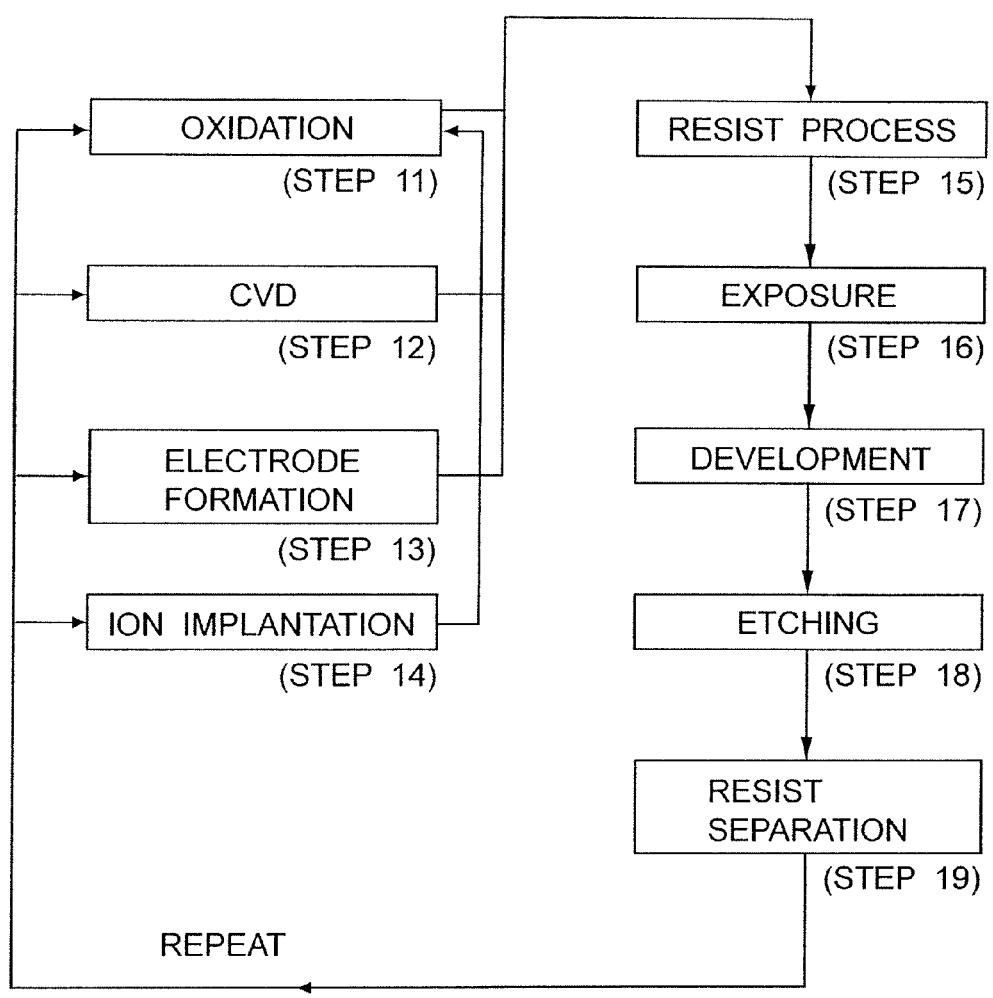
FIG. 15 is a flow chart for explaining details of a wafer process in the procedure of FIG. 14.
Figure 16:
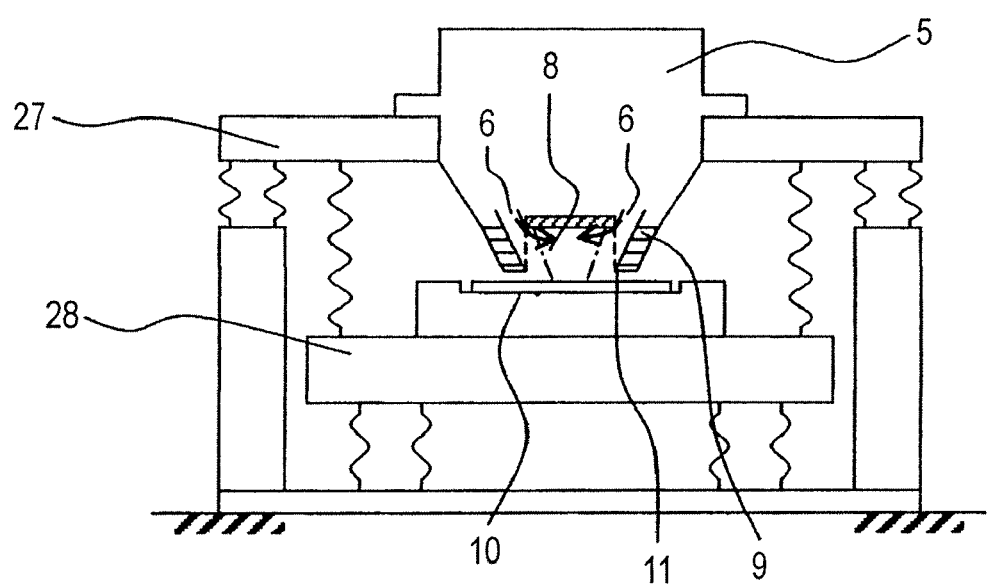
FIG. 16 is a schematic view of an exposure apparatus of a known type, having purge means.

FIG. 15 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are formed on the wafer.

With these processes, high density microdevices can be manufactured at a lower cost.

The present invention can be embodied in various forms, examples of which are as follows.

(1) An exposure apparatus for projecting a pattern of a mask onto a photosensitive substrate through a projection optical system, characterized by a cover for surrounding an exposure light path from a wafer side lower end of the projection optical system to near a wafer stage, a first supply port provided in the cover, for blowing at least a purge gas, and a first collection port at the lower end of the cover, for sucking at least one of a purge gas, a purge gas having an impurity concentration higher than that of the first-mentioned purge gas and atmosphere.

The first supply port is provided inside the cover to supply a purge gas into the inside of the cover. By this, a flow of purge gas flowing from the inside of the cover to the outside of the cover is created, and the pressure inside the cover becomes higher than the pressure outside the cover, whereby the inside of the cover can be purged. The first collection port is provided at the lower end of the cover, by which the purge gas can be collected through the first collection port. This effectively reduces the flow rate of purge gas flowing outwardly from the inside of the cover. Thus, non-uniformness of purge gas concentration produced around the wafer stage can be reduced, and a measurement error of a laser interferometer can be reduced effectively.

With the structure described above, by providing a single first supply port inside the cover, the inside of the cover can be purged. Also, by providing only the first collection port at the lower end of the cover, the measurement error of the laser interferometer can be reduced. In an exposure apparatus having the structure described above, the positions where the first supply port and the first collection port are to be provided are not limited. With a very simple structure that the first supply port is provided inside the cover while the first collection port is provided at the lower end of the cover, it is assured to purge the inside of the cover and to reduce the measurement error of the laser interferometer.

Figure 17:
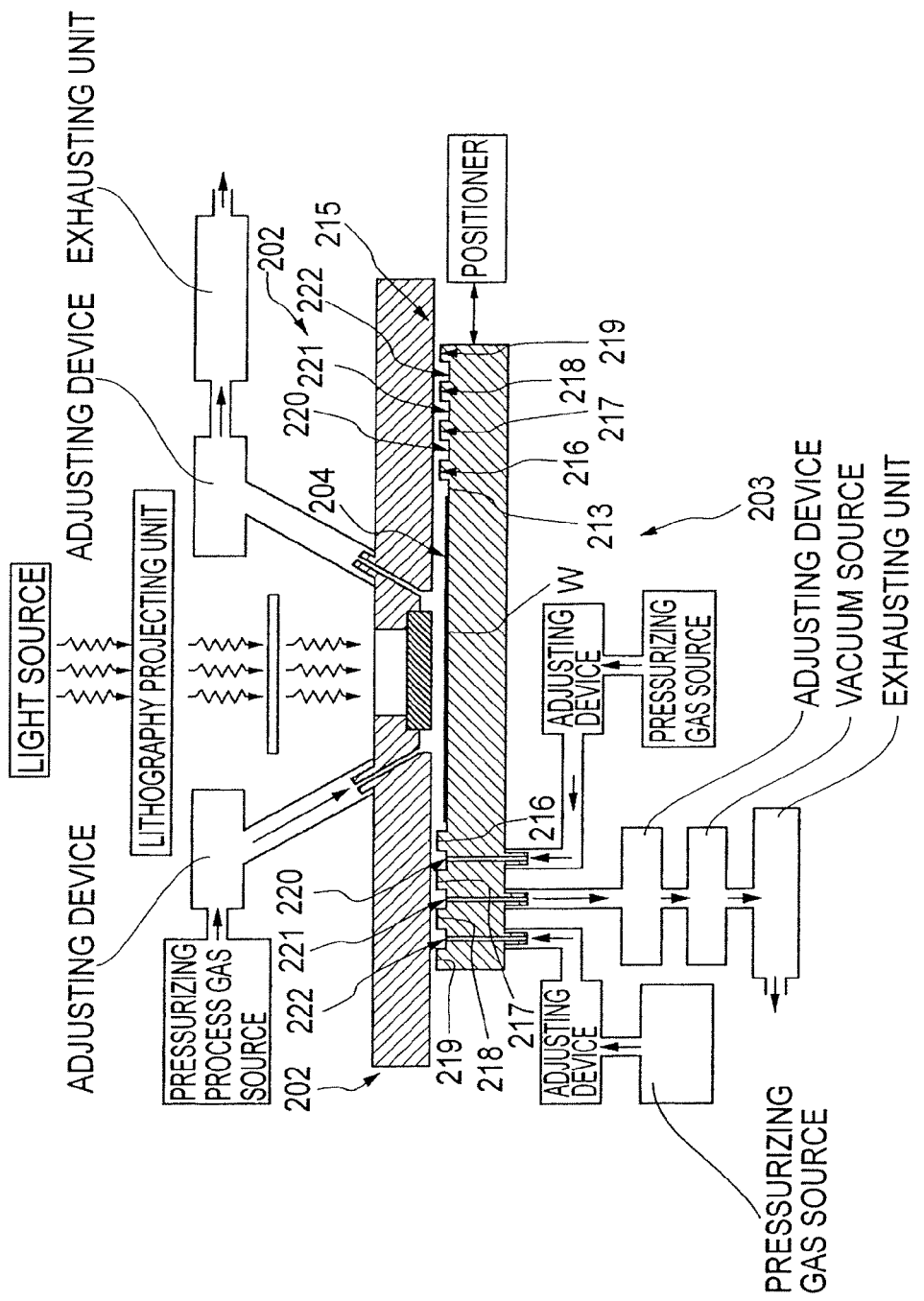
FIG. 17 is a schematic and diagrammatic view of another example of a known type of exposure apparatus having purge means.

Further, with the structure described above, a flow of purge gas flowing from the inside of the cover to the outside of the cover is produced, and the pressure inside the cover is higher than the pressure outside the cover. Therefore, it is not necessary to make the clearance between the cover and the wafer or between the cover and the wafer stage very small. A sufficiently wide spacing can be held to avoid interference between the cover and the wafer or between the cover and the wafer stage. With the above-described structure, therefore, without provision of gas bearings, such as adopted in the exposure apparatus of FIG. 17 or 18, interference between the cover and the wafer or between the cover and the wafer stage can be avoided, and the manufacturing cost of the apparatus can be made lower.

(2) An exposure apparatus according to Item (1), characterized by a wafer stage being able to be driven in mutually orthogonal X and Y directions, and laser interferometers for measuring the position with respect to the X and Y directions, wherein an X-axis measurement mirror and a Y-axis measurement mirror are provided on the wafer stage so that their reflection surfaces are disposed perpendicularly to an X-axis measurement light path and a Y-axis measurement light path, respectively, and wherein the first collection port is provided at the lower end of the cover, adjacent to the X-axis measurement mirror and the Y-axis measurement mirror.

Referring to FIGS. 9A, 9B, 20A and 20B, advantageous effects obtainable with the structure that the first collection port 13 is provided at the lower end of the cover, adjacent to the X-axis measurement mirror 16 and the Y-axis measurement mirror 19, will be explained. FIGS. 9A and 9B are plan views, respectively, of a portion around the wafer stage 10 in a case wherein the first collection port 13 is provided at the lower end of the cover, adjacent to the X-axis measurement mirror 16 and the Y-axis measurement mirror 19, and these drawings are schematic contour-line illustrations regarding the purge gas concentration distribution. In the contour-line illustrations of FIGS. 9A and 9B, the darker the color is, the higher the purge gas concentration is, and the lighter the color is, the lower the purge gas concentration is.

FIG. 9A is a schematic contour-line chart of a purge gas concentration distribution as the wafer stage 10 has moved closest to the X-axis laser interferometer 14 and the Y-axis laser interferometer 17, in the exposure operation. FIG. 9B is a schematic contour-line chart of a purge gas concentration distribution as the wafer stage 10 has moved most remote from the X-axis laser interferometer 14 and the Y-axis laser interferometer 17, in the exposure operation. Comparing FIGS. 9A and 9B with the conventional example shown in FIGS. 20A and 20B, it is seen that, in accordance with this form of the invention, with the provision of the collection port 13 at the lower end of the cover, adjacent to the X-axis measurement mirror and the Y-axis measurement mirror, the flow rate of purge gas flowing outwardly into the X-axis measurement light path 15 and the Y-axis measurement light path 18 is reduced in both the case (FIG. 9A or 20A) wherein the wafer stage 10 is closest to the laser interferometers 14 and 17 and the case (FIG. 9B or 20B) wherein it is most remote from them, and the unevenness of purge gas concentration in the X-axis measurement light path 15 and the Y-axis measurement light path 18 is reduced.

With the provision of the first collection port 13 at the lower end of the cover, adjacent to the X-axis measurement mirror 16 and the Y-axis measurement mirror 19, the flow rate of purge gas flowing outwardly into the X-axis measurement light path 15 and the Y-axis measurement light path 18 can be reduced. Thus, the unevenness the of purge gas concentration to be produced in the X-axis measurement light path 15 and the Y-axis measurement light path 18 can be reduced, and the measurement error of the laser interferometer can be reduced effectively.

Therefore, with a very simple structure that a first supply port 6 is provided inside the cover 9 and a first collection port 13 is provided at a lower end portion of the cover 9, adjacent to the X-axis measurement mirror 16 and the Y-axis measurement mirror 19, it is assured to purge the inside of the cover 9, and a measurement error of the laser interferometer can be prevented effectively.

(3) An exposure apparatus according to Item (2), characterized by including temperature controlling means for blowing a gas toward a position opposed to a reflection surface of the X-axis measurement mirror or a reflection surface of the Y-axis measurement mirror.

(4) An exposure apparatus according to Item (3), wherein the gas blown by the temperature adjusting means is an atmospheric gas or an inactive gas having an impurity concentration higher than that of the purge gas.

Figure 11A:
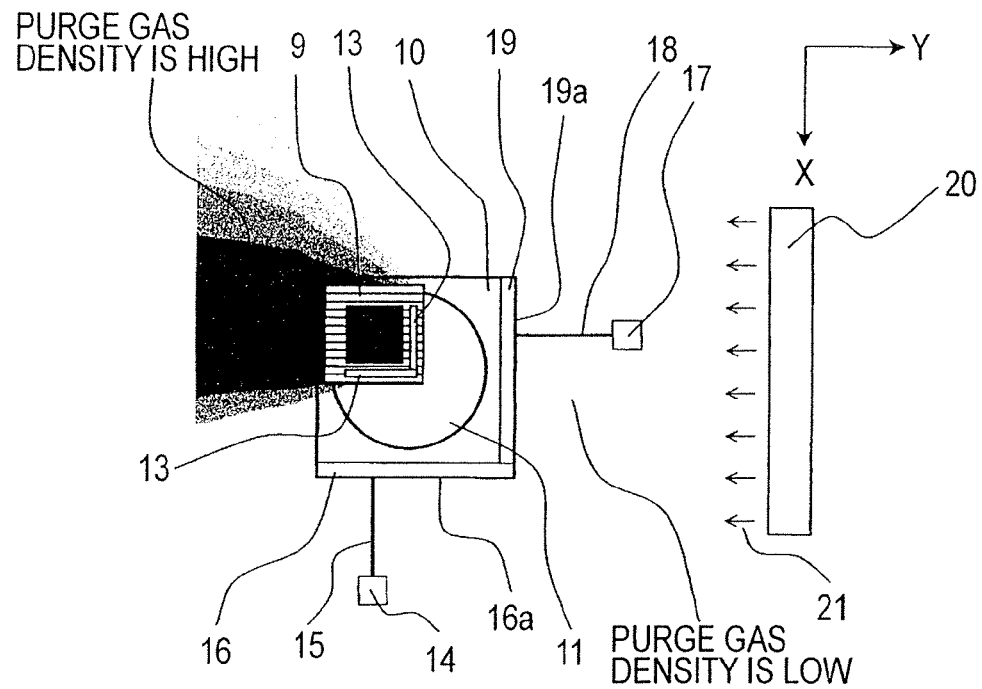
FIGS. 11A and 11B are schematic illustrations of a purge gas concentration distribution around a wafer stage, in the exposure apparatus of FIGS. 10A and 10B.
Figure 11B:
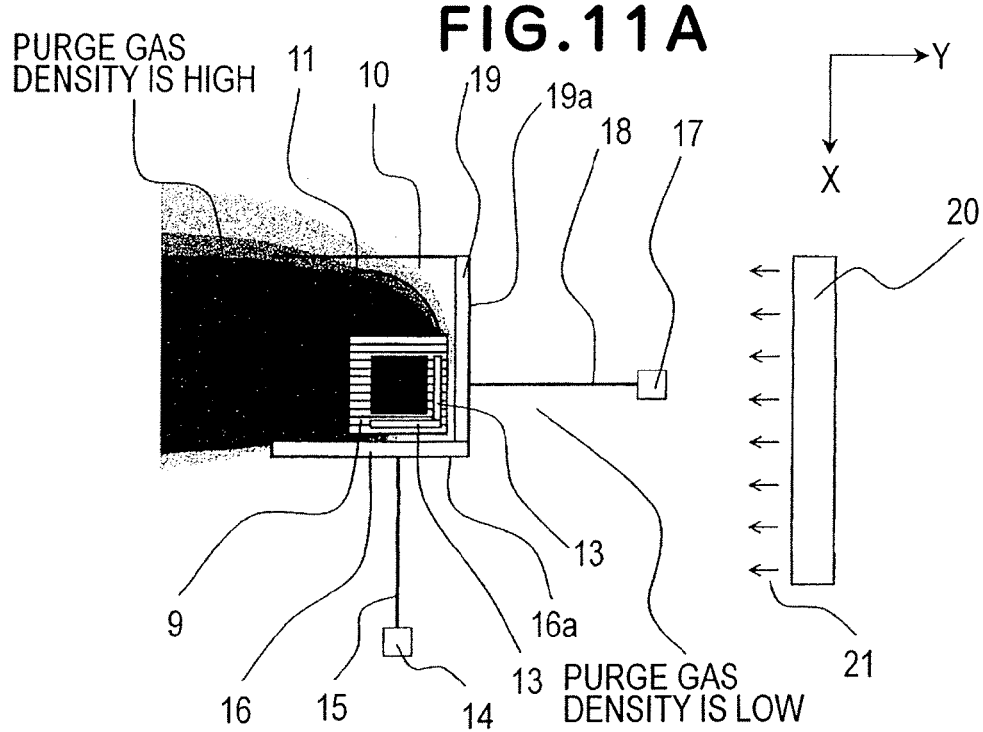

Now, referring to FIGS. 11A and 11B, advantageous effects of the provision of temperature adjusting means for blowing a gas to a position opposed to the mirror reflection surface, will be explained. FIGS. 11A and 11B are schematic contour-line illustrations of a purge gas concentration distribution inside and around the cover 9, in a case wherein the first collection port 13 is provided at the lower end of the cover 9, adjacent to the X-axis measurement mirror 16 and the Y-axis measurement mirror 19, and wherein an air conditioning system 20 is provided to blow a gas toward a position opposed to a reflection surface 19a of the Y-axis measurement mirror 19, such that a gas is blown from the air conditioning system 20 toward the area around the wafer stage 10. In the schematic contour-line illustrations of FIGS. 11A and 11B, the darker the color is, the higher the purge gas concentration is, and the lighter the color is, the lower the purge gas concentration is. A white color area depicts a zone where no purge gas is present.

FIG. 11A is a schematic contour-line illustration of a purge gas concentration distribution as the wafer stage 10 has moved closest to the X-axis laser interferometer 14 and the Y-axis laser interferometer 17, in the exposure operation. FIG. 11B is a schematic contour-line illustration of a purge gas concentration distribution as the wafer stage 10 has moved most remote from the X-axis laser interferometer 14 and the Y-axis laser interferometer 14 and the Y-axis laser interferometer 17, in the exposure operation. From FIGS. 11A and 11B, it is seen that, in both of the case (FIG. 11A) wherein the wafer stage 10 is closest to the interferometers 14 and 17 and the case (FIG. 11B) wherein it is most remote from them, there is approximately no purge gas present in the X-axis measurement light path 15 and the Y-axis measurement light path 18 and, therefore, there is no purge gas concentration distribution there.

As described above, in the structure that a first collection port 13 is provided at the lower end of the cover, adjacent to the X-axis measurement mirror 15 and the Y-axis measurement mirror 19, while on the other hand, an air conditioning system 20 for blowing a gas toward the position opposed to the reflection surface 19a of the Y-axis measurement mirror 19 is provided so that a gas 21 is blown by the air conditioning system 20 toward the area around the wafer stage, regardless of the wafer stage position, it is possible to prevent production of an uneven purge gas concentration in the X-axis measurement light path 15 and the Y-axis measurement light path 18. As a result, a measurement error of the laser interferometer can be avoided effectively.

In FIGS. 11A and 11B, the air conditioning system 20 is provided at a position opposed to the reflection surface 19a of the Y-axis measurement mirror 19. However, the air conditioning system 20 may be provided at a position facing the reflection surface 16a of the X-axis measurement mirror 16. Similar advantageous results as those in the third embodiment are obtainable even with such a structure.

In accordance with this form of the present invention, with a very simple structure that, in addition to the structure mentioned in Item (2), an air conditioning system 20 is provided at a position opposed to the reflection surface 16a of the X-axis measurement mirror 16 or the reflection surface 19a of the Y-axis measurement mirror 19, it is assured to purge the inside of the cover 9, and a measurement error of the laser interferometer can be prevented effectively.

(5) An exposure apparatus according to Item (1), wherein the first collection port is provided 10 so as to surround the outer periphery of an exposure area.

(6) An exposure apparatus according to Item (5), wherein the collection flow rate through the first collection port is greater than the supply 15 flow rate through the first supply port.

(7) An exposure apparatus according to Item (5), wherein a second collection port is provided outside the first collection port, so as to surround the outer periphery of the exposure area.

(8) An exposure apparatus according to Item (7), wherein the collection flow rate through the first collection port is less than the supply flow rate through the first supply port, and wherein the total amount of the collection flow rate through the first and second collection ports is greater than the supply amount through the first supply port.

(9) An exposure apparatus according to any one of Items (1)-(5) and (7), wherein a third collection port for sucking the purge gas is provided inside the cover and at a position opposed to the first supply port, so that the purge gas is caused to flow in one direction inside the cover.

(10) An exposure apparatus according to Item (5), wherein a third collection port for sucking the purge gas is provided inside the cover and at a position opposed to the first supply port, so that the purge gas is caused to flow in one direction inside the cover, and wherein the collection flow rate through the third collection port is less than the supply flow rate through the first supply port, while the total collection flow rate through the first and third collection ports is greater than the supply flow rate through the first supply port.

(11) An exposure apparatus according to any one of Items (1)-(5) and (7), wherein a third collection port for sucking the purge gas is provided inside the cover and at a position opposed to the first supply port, so that the purge gas is caused to flow in one direction inside the cover, and wherein a second supply port is provided inside the first collection port and at the lower end of the cover at least adjacent to the first supply port.

(12) An exposure apparatus according to Item (5), wherein a third collection port for sucking the purge gas is provided inside the cover and at a position opposed to the first supply port, so that the purge gas is caused to flow in one direction inside the cover, wherein a second supply port is provided inside the first collection port and at the lower end of the cover at least adjacent to the first supply port, and wherein the collection flow rate through the third collection port is less than the total supply flow rate through the first and second supply ports, while the total collection flow rate through the first and third collection ports is greater than the total supply flow rate through the first and second supply ports.

(13) An exposure apparatus according to any one of Items (1)-(12), wherein means for collecting the purge gas and/or atmosphere from the first or third collection port comprises a scroll type vacuum pump or a vacuum ejector.

(14) An exposure apparatus according to any one of Items (1)-(13), wherein a reservoir is provided in a portion of a pipe for collecting the purge gas and/or atmosphere from the first or third collection port.

(15) An exposure apparatus according to any one of Items (1)-(14), wherein one or more first pressure sensors for measuring the pressure inside the cover are provided inside the cover, wherein one or more second pressure sensors for measuring the pressure outside the cover are provided outside the cover, wherein one or more third pressure sensors for measuring the pressure near the fist collection port are provided at the lower end of the cover, adjacent to the first collection port, and wherein, on the basis of the measurement made through at least one of the first to third pressure sensors, at least one of the supply flow rate through the first supply port, the collection flow rate through the first collection port, the supply flow rate through the second supply port, and the collection flow rate through the third collection port is controlled so as to ensure that the pressure inside the cover becomes higher than the pressure outside the cover and/or that the pressure inside the cover becomes higher than the pressure around the first collection port.

In accordance with these forms of the present invention described above, in an exposure apparatus using ultraviolet light, particularly, ArF excimer laser light or fluorine ($F_2$) excimer laser light, the inside of the exposure light path near a photosensitive substrate can be purged stably without being influenced externally and, additionally, non-uniformness of purge gas concentration around the substrate stage can be reduced effectively. As a result, the manufacturing cost of the exposure apparatus can be reduced, yet sufficient transmissivity as well as uniformness and stability of the ArF excimer laser light or fluorine ($F_2$) excimer laser light are accomplished. Furthermore, the positioning of the wafer substrate stage can be carried out very precisely. Therefore, projection exposure can be done very precisely and, thus, a fine circuit pattern can be projected satisfactorily.

While the invention has been described with reference to the structures disclosed herein, it is not confined to the details set forth and this application is intended to cover such modifications or changes as may come within the purposes of the improvements or the scope of the following claims.

This application claims priority from Japanese Patent Application No. 2003-388198, filed Nov. 18, 2003, which is hereby incorporated by reference.

The invention claimed is:

1. An exposure apparatus for exposing a substrate to an image of a pattern of an original, the apparatus comprising:
   a projection optical system configured to project the image onto the substrate;
   a stage configured to hold the substrate;
   a cover configured to substantially surround an exposure light path between an end portion of the projection optical system and the stage, the end portion facing the stage;
   a supply port provided inside the cover, via which a purge gas is supplied into a space surrounded by the cover; and
   a first exhaust port provided in an end portion of the cover, via which the gas is exhausted from the space, the end portion of the cover facing the stage.

2. An apparatus according to claim 1, further comprising a second exhaust port provided in the end portion of the cover and at a position outside the first exhaust port, via which the gas is exhausted from the space.

3. An apparatus according to claim 1, further comprising a third exhaust port provided in the cover, opposed to the supply port, via which the gas is exhausted from the space.

4. An apparatus according to claim 1, further comprising a vacuum pump configured to exhaust the gas via the first exhaust port.

5. A method of manufacturing a device, the method comprising:
   exposing a substrate to an image of a pattern of an original by use of exposure apparatus defined in claim 1;
   developing the exposed substrate; and
   processing the developed substrate to manufacture the device.

* * * * *